(12) United States Patent
Kim et al.

(10) Patent No.: US 10,636,921 B2
(45) Date of Patent: Apr. 28, 2020

(54) SOLAR CELL MODULE AND METHOD FOR MANUFACTURING THE SAME

(71) Applicant: LG ELECTRONICS INC., Seoul (KR)

(72) Inventors: Taeyoon Kim, Seoul (KR); Minpyo Kim, Seoul (KR); Hyeyoung Yang, Seoul (KR); Taeki Woo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 181 days.

(21) Appl. No.: 15/708,754

(22) Filed: Sep. 19, 2017

(65) Prior Publication Data

US 2018/0013019 A1   Jan. 11, 2018

Related U.S. Application Data

(62) Division of application No. 14/524,680, filed on Oct. 27, 2014, now Pat. No. 9,799,782.

(30) Foreign Application Priority Data

Oct. 29, 2013   (KR) .................. 10-2013-0129421

(51) Int. Cl.
   *H01L 31/0224*   (2006.01)
   *H01L 31/048*   (2014.01)
   (Continued)

(52) U.S. Cl.
   CPC .... *H01L 31/022441* (2013.01); *H01L 31/048* (2013.01); *H01L 31/0508* (2013.01); *H01L 31/0512* (2013.01); *H01L 31/0516* (2013.01); *H01L 31/0547* (2014.12); *H01L 31/0682* (2013.01); *Y02E 10/52* (2013.01); *Y02E 10/547* (2013.01)

(58) Field of Classification Search
   CPC . H01L 31/0516; H01L 31/0682; H01L 31/05; H01L 31/048; H01L 31/022441
   See application file for complete search history.

(56) References Cited

U.S. PATENT DOCUMENTS

| 5,330,585 A | 7/1994 | Chang et al. |
| 8,314,323 B2 | 11/2012 | Hishida et al. |

(Continued)

FOREIGN PATENT DOCUMENTS

| CN | 103035763 A | 4/2013 |
| EP | 2320477 A1 | 5/2011 |

(Continued)

*Primary Examiner* — Golam Mowla
(74) *Attorney, Agent, or Firm* — Birch, Stewart, Kolasch & Birch, LLP

(57) ABSTRACT

A method for manufacturing a solar cell module, the method includes a cell forming operation for forming a first solar cell and a second solar cell by, for each of the first and second solar cells, attaching a first auxiliary electrode and a second auxiliary electrode to a back surface of a semiconductor substrate on which a plurality of first electrodes and a plurality of second electrodes are formed; and a cell string forming operation for connecting the first auxiliary electrode of the first solar cell to the second auxiliary electrode of the second solar cell through an interconnector to form a cell string.

11 Claims, 30 Drawing Sheets

(51) Int. Cl.
*H01L 31/05* (2014.01)
*H01L 31/068* (2012.01)
*H01L 31/054* (2014.01)

(56) References Cited

U.S. PATENT DOCUMENTS

| | | |
|---|---|---|
| 9,515,200 B2 | 12/2016 | Nakauchi et al. |
| 2007/0199592 A1 | 8/2007 | Agui et al. |
| 2010/0018565 A1 | 1/2010 | Funakoshi |
| 2010/0051085 A1* | 3/2010 | Weidman ........ H01L 31/022441 136/244 |
| 2010/0200058 A1 | 8/2010 | Funakoshi |
| 2011/0114179 A1* | 5/2011 | Funakoshi .......... H01L 31/0516 136/259 |
| 2011/0277817 A1 | 11/2011 | Ide et al. |
| 2012/0097245 A1 | 4/2012 | Nishina et al. |
| 2012/0103389 A1 | 5/2012 | Shin et al. |
| 2012/0103408 A1 | 5/2012 | Moslehi et al. |
| 2012/0240984 A1 | 9/2012 | Kim et al. |
| 2013/0081675 A1 | 4/2013 | Joe et al. |
| 2014/0102515 A1 | 4/2014 | Sakuma et al. |

FOREIGN PATENT DOCUMENTS

| | | |
|---|---|---|
| EP | 2423973 A1 | 2/2012 |
| EP | 2 439 784 A1 | 4/2012 |
| EP | 2525415 A2 | 11/2012 |
| EP | 2575184 A2 | 4/2013 |
| JP | 6-244443 A | 9/1994 |
| JP | 2005-11869 A | 1/2005 |
| JP | 2007-227786 A | 9/2007 |
| JP | 2007-281044 A | 10/2007 |
| JP | 2008-235819 A | 10/2008 |
| JP | 2009-88145 A | 4/2009 |
| JP | 2011-3724 A | 1/2011 |
| JP | 2011-49514 A | 3/2011 |
| JP | 2012-49390 A | 3/2012 |
| JP | 2013-8785 A | 1/2013 |
| JP | 2013-45950 A | 3/2013 |
| JP | 2013-73971 A | 4/2013 |
| JP | 2013-77820 A | 4/2013 |
| KR | 10-2007-0104742 A | 10/2007 |
| KR | 10-2013-0034869 A | 4/2013 |
| WO | WO 2008/090718 A1 | 7/2008 |
| WO | WO 2012/128284 A1 | 9/2012 |
| WO | WO 2013/031384 A1 | 3/2013 |
| WO | WO 2013/161030 A1 | 10/2013 |

* cited by examiner

SOLAR CELL MODULE AND METHOD FOR MANUFACTURING THE SAME

CROSS-REFERENCE TO RELATED APPLICATION

This application is a Divisional of co-pending U.S. patent application Ser. No. 14/524,680 filed on Oct. 27, 2014, which claims the benefit under 35 U.S.C. § 119(a) to Korean Patent Application No. 10-2013-0129421 filed on Oct. 29, 2013, all of which are hereby expressly incorporated by reference into the present application.

BACKGROUND OF THE INVENTION

Field of the Invention

Embodiments of the invention relate to a solar cell module and a method for manufacturing the same.

Discussion of the Related Art

A solar cell generally includes a substrate and an emitter region, which are formed of semiconductors of different conductive types, for example, a p-type and an n-type, and electrodes respectively connected to the substrate and the emitter region. A p-n junction is formed at an interface between the substrate and the emitter region.

In recent, a solar cell, in which electrodes are not formed on a light receiving surface of a silicon substrate and n-type electrodes and p-type electrodes are formed only on another surface of the silicon substrate, has been continuously studied and developed so as to increase efficiency of the solar cell. Further, a module technology for electrically connecting the plurality of solar cells has been continuously studied and developed.

Examples of the module technology typically include a method for electrically connecting the plurality of solar cells using metal interconnectors and a method for electrically connecting the plurality of solar cells using a wiring substrate, on which wirings are previously formed.

SUMMARY OF THE INVENTION

In one aspect, there is a solar cell module including a first solar cell and a second solar cell each including a plurality of first electrodes formed on a back surface of a semiconductor substrate, a plurality of second electrodes which are formed in parallel with the plurality of first electrodes on the back surface of the semiconductor substrate, a first auxiliary electrode connected to the plurality of first electrodes, and a second auxiliary electrode connected to the plurality of second electrodes, and an interconnector configured to electrically connect the first auxiliary electrode of the first solar cell to the second auxiliary electrode of the second solar cell.

The interconnector and the first and second auxiliary electrodes of the first and second solar cells may contain different materials.

The interconnector may be different from the first and second auxiliary electrodes of the first and second solar cells in at least one of a width, a thickness, a layer structure, and a plane pattern.

The interconnector may be connected to the first and second auxiliary electrodes of the first and second solar cells using a conductive adhesive.

The first and second auxiliary electrodes of the first solar cell may be spatially separated from the first and second auxiliary electrodes of the second solar cell.

The solar cell module may further include a front glass substrate positioned on a front surface of a cell string formed by electrically connecting the first solar cell and the second solar cell through the interconnector, an upper encapsulant positioned between the front glass substrate and the cell string, a lower encapsulant positioned on a back surface of the cell string, and a back sheet positioned on a back surface of the lower encapsulant.

In each of the first solar cell and the second solar cell, the first auxiliary electrode may include a first auxiliary electrode pad connected to the interconnector, and the second auxiliary electrode may include a second auxiliary electrode pad connected to the interconnector.

Each of the first and second auxiliary electrode pads may include a first area overlapping the semiconductor substrate and a second area not overlapping the semiconductor substrate.

The first auxiliary electrode pad included in the first solar cell may be separated from the second auxiliary electrode pad included in the second solar cell.

The interconnector may electrically connect the first auxiliary electrode pad included in the first solar cell to the second auxiliary electrode pad included in the second solar cell. For example, the interconnector may electrically connect the second area of the first auxiliary electrode pad included in the first solar cell to the second area of the second auxiliary electrode pad included in the second solar cell.

The interconnector may be electrically connected to the first auxiliary electrode pad or the second auxiliary electrode pad using a conductive adhesive. Alternatively, the interconnector and the first auxiliary electrode pad may physically contact each other and may be electrically connected to each other, or the interconnector and the second auxiliary electrode pad may physically contact each other and may be electrically connected to each other.

A front surface of the interconnector may be formed as an uneven surface, and a thickness of the interconnector may be non-uniform. Alternatively, a thickness of the interconnector may be uniform, and the interconnector may have a zigzag shape.

The solar cell module may further include a first cell string and a second string, each of which is formed by connecting the first solar cell and the second solar in series in a first direction through the interconnector, and a conductive ribbon configured to connect the first cell string and the second string in series in a second direction crossing the first direction.

In another aspect, there is a method for manufacturing a solar cell module including a cell forming operation for forming a first solar cell and a second solar cell, each having a first auxiliary electrode and a second auxiliary electrode attached to a back surface of a semiconductor substrate, and on which a plurality of first electrodes and a plurality of second electrodes are formed in parallel with each other, a cell string forming operation for connecting the first auxiliary electrode of the first solar cell to the second auxiliary electrode of the second solar cell through an interconnector to form a cell string on a front glass substrate, and forming a back sheet on the cell string.

The cell forming operation may include an attaching operation for attaching an insulating member, on which the first auxiliary electrode and the second auxiliary electrode are formed, to the back surface of the semiconductor substrate, and a peeling operation for separating the insulating member from the first auxiliary electrode and the second auxiliary electrode.

The first auxiliary electrode and the second auxiliary electrode may be temporarily attached to the insulating member using a crosslinking agent. The crosslinking agent may contain a thermoplastic resin.

The attaching operation may include attaching and connecting the first auxiliary electrode to the plurality of first electrodes using a conductive adhesive and attaching and connecting the second auxiliary electrode to the plurality of second electrodes using the conductive adhesive.

A temperature of the peeling operation may be lower than a temperature of the attaching operation. For example, the temperature of the attaching operation may be about 130° C. to 250° C., and the temperature of the peeling operation may be about 80° C. to 130° C.

When a temperature is reduced after the second auxiliary electrode is attached to the plurality of second electrodes in the attaching operation, the peeling operation may be performed. Alternatively, after the attaching operation is completed, the peeling operation may be performed through a thermal processing or an irradiation of an ultraviolet ray.

The cell string forming operation may include attaching one side of the interconnector to a first auxiliary electrode pad included in the first auxiliary electrode of the first solar cell and attaching the other side of the interconnector to a second auxiliary electrode pad included in the second auxiliary electrode of the second solar cell.

The cell forming operation may include forming an insulating layer on the entire back surface of the semiconductor substrate to cover the plurality of first electrodes and the plurality of second electrodes formed on the back surface of the semiconductor substrate, locally opening a portion of the insulating layer to expose the plurality of first electrodes and the plurality of second electrodes, forming a metal layer on the entire surface of the insulating layer and on upper parts of the plurality of first and second electrodes exposed through the opened portion of the insulating layer, and removing a remaining portion of the metal layer except a portion of the metal layer connected to the plurality of first and second electrodes to form the first auxiliary electrode and the second auxiliary electrode.

The forming of the metal layer may be performed through a sputtering method. A portion of the metal layer may be connected to the plurality of first and second electrodes, and the metal layer and the plurality of first and second electrodes may form one body.

The forming of the first and second auxiliary electrodes may include removing the insulating layer formed between the back surface of the semiconductor substrate and the metal layer to remove the remaining portion of the metal layer along with the removed insulating layer.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE EMBODIMENTS

Reference will now be made in detail to embodiments of the invention, examples of which are illustrated in the accompanying drawings. This invention may, however, be embodied in many different forms and should not be construed as limited to the embodiments set forth herein. Wherever possible, the same reference numbers will be used throughout the drawings to refer to the same or like parts. It will be paid attention that detailed description of known arts will be omitted if it is determined that the arts can mislead the embodiments of the invention.

In the following description, "front surface" may be one surface of a semiconductor substrate or one surface of a front glass substrate, on which light is directly incident, and "back surface" may be a surface opposite the one surface of the semiconductor substrate or the front glass substrate, on which light is not directly incident or reflective light may be incident.

Exemplary embodiments of the invention will be described with reference to FIGS. 1 to 20F.

Figure 1:
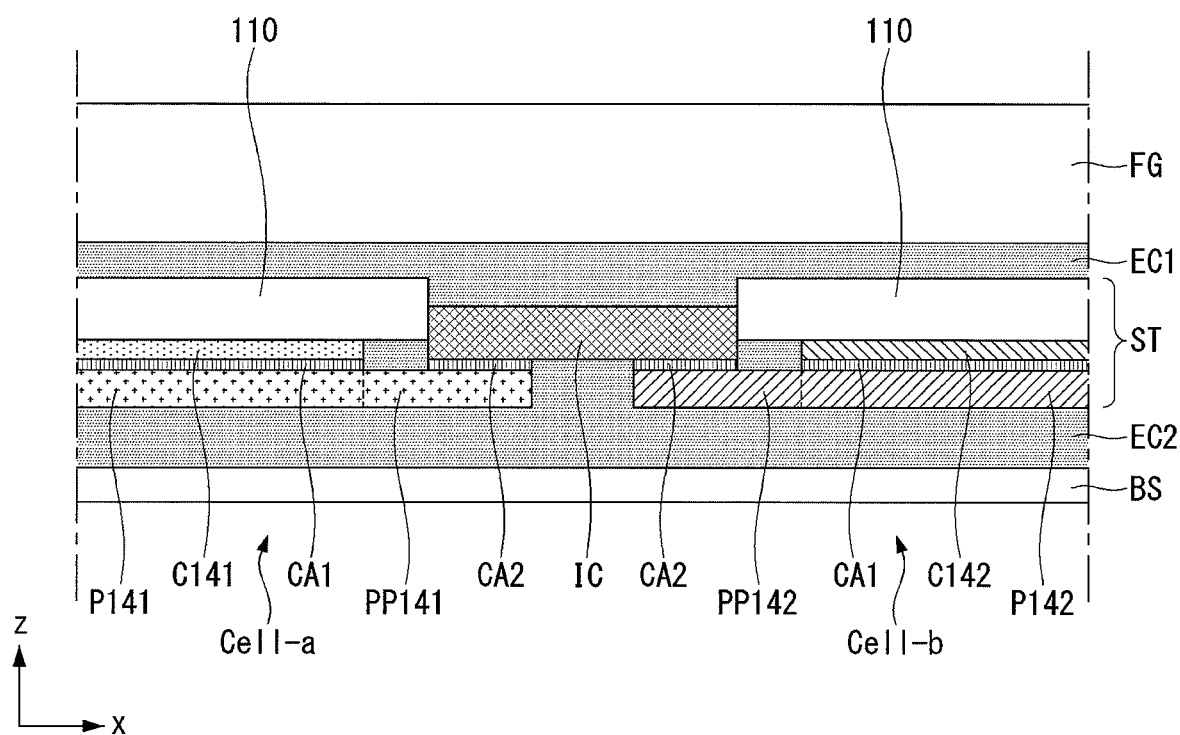
FIG. 1 illustrates a solar cell module according to an example embodiment of the invention.

FIG. 1 illustrates a solar cell module according to an example embodiment of the invention.

As shown in FIG. 1, a solar cell module according to an example embodiment of the invention may include a front glass substrate FG, an upper encapsulant EC1, a plurality of solar cells including a first solar cell Cell-a and a second solar cell Cell-b, an interconnector IC for electrically connecting the plurality of solar cells, a lower encapsulant EC2, and a back sheet BS.

Each of the plurality of solar cells including the first solar cell Cell-a and the second solar cell Cell-b includes a plurality of first electrodes C141 formed on a back surface of a semiconductor substrate 110, a plurality of second electrodes C142 formed on the back surface of the semiconductor substrate 110, a first auxiliary electrode P141 connected to the plurality of first electrodes C141, a second auxiliary electrode P142 connected to the plurality of second electrodes C142. An emitter region and a back surface field region were not shown in FIG. 1. However, the emitter region and the back surface field region may be formed at the semiconductor substrate 110 included in each solar cell. This is described in detail with reference to FIGS. 2 and 3.

One of the first auxiliary electrode P141 and the second auxiliary electrode P142 of the first solar cell Cell-a may be connected to one of the first auxiliary electrode P141 and the second auxiliary electrode P142 of the second solar cell Cell-b through the interconnector IC. Hence, the first solar cell Cell-a and the second solar cell Cell-b may be connected in series.

FIG. 1 shows that the first auxiliary electrode P141 of the first solar cell Cell-a and the second auxiliary electrode P142 of the second solar cell Cell-b are connected through the interconnector IC, as an example. On the contrary, the second auxiliary electrode P142 of the first solar cell Cell-a and the first auxiliary electrode P141 of the second solar cell Cell-b may be connected through the interconnector IC.

As described above, the plurality of solar cells including the first solar cell Cell-a and the second solar cell Cell-b may be connected to one another through the interconnector IC to form a cell string.

As shown in FIG. 1, the front glass substrate FG may be positioned on a front surface of the cell string, in which the first solar cell Cell-a and the second solar cell Cell-b are connected to each other through the interconnector IC. The front glass substrate FG may be formed of a tempered glass having a high transmittance and a damage prevention function. In this instance, the tempered glass may be a low iron tempered glass containing a small amount of iron. The front glass substrate FG may have an embossed inner surface so as to increase a scattering effect of light.

The upper encapsulant EC1 may be positioned between the front glass substrate FG and the cell string, and the lower encapsulant EC2 may be positioned on a back surface of the cell string, namely, between the back sheet BS and the cell string.

The upper encapsulant EC1 and the lower encapsulant EC2 may be formed of a material which prevents corrosion of a metal resulting from the moisture penetration and protects the solar cell module from an impact. For example, the upper encapsulant EC1 and the lower encapsulant EC2 may be formed of ethylene vinyl acetate (EVA). Other materials may be used.

As shown in FIG. 1, a lamination process is performed in a state where the upper encapsulant EC1 and the lower encapsulant EC2 are respectively positioned on and under the plurality of solar cells, and thus the upper encapsulant EC1, the lower encapsulant EC2, and the plurality of solar cells may form one body.

The back sheet BS of a sheet type may be positioned on a back surface of the lower encapsulant EC2 and may prevent the moisture from penetrating into a back surface of the solar cell module. A glass substrate may be used instead of the back sheet BS. However, when the back sheet BS is used, the manufacturing cost and the weight of the solar cell module may be further reduced.

When the back sheet BS is formed in the sheet type, the back sheet BS may be formed of an insulating material, for example, FP/PE/FP (fluoropolymer/poly ester/fluoropolymer).

The detailed structure of each of the first solar cell Cell-a and the second solar cell Cell-b is described below.

Figure 2:
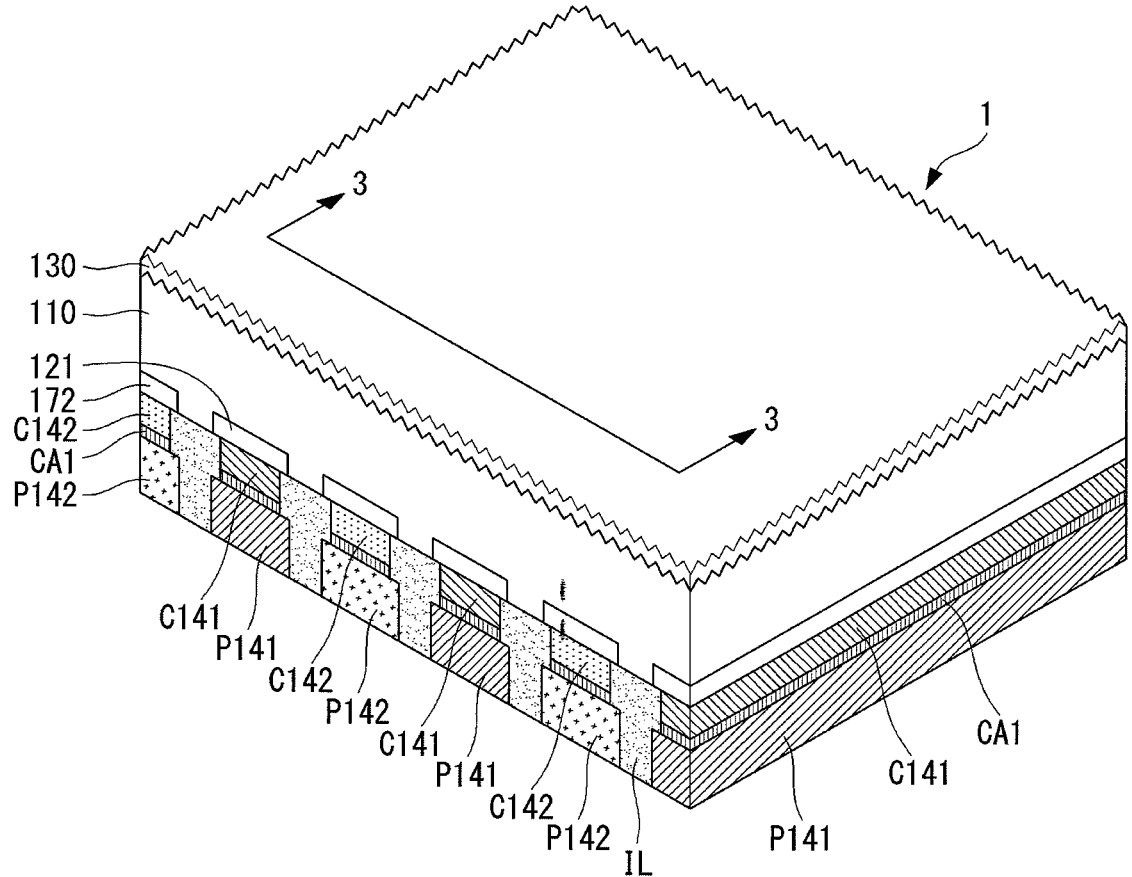
FIGS. 2 and 3 show an example of a solar cell applicable to the solar cell module shown in FIG. 1.
Figure 3:
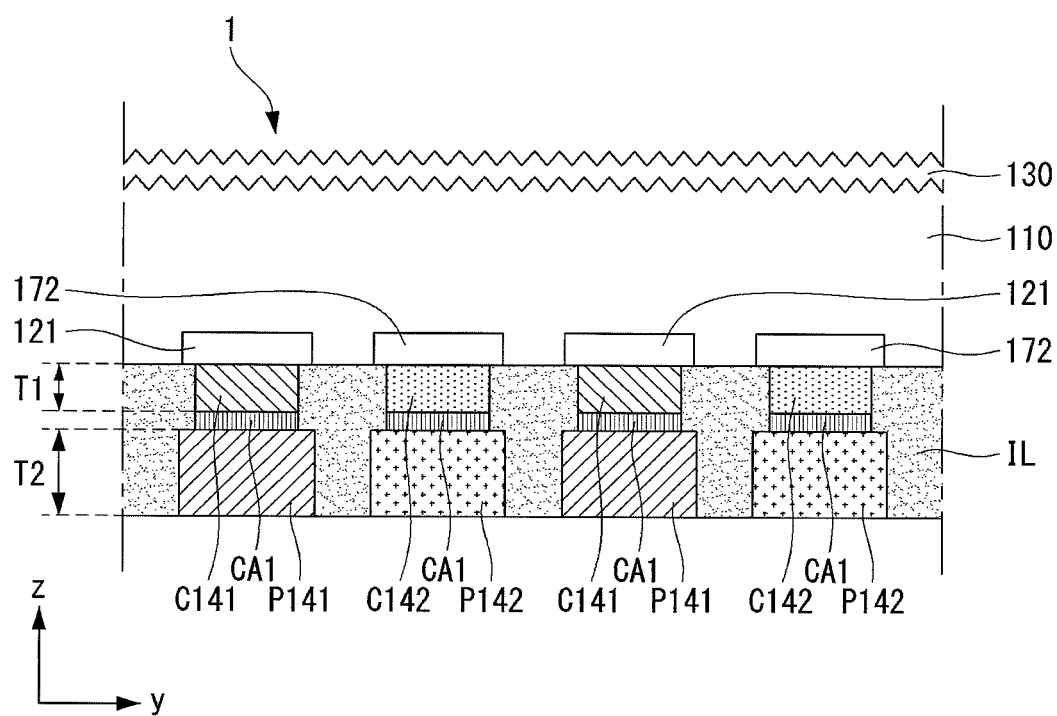

FIGS. 2 and 3 show an example of a solar cell applicable to the solar cell module shown in FIG. 1.

More specifically, FIG. 2 is a partial perspective view of a solar cell according to the embodiment of the invention, and FIG. 3 is a cross-sectional view taken along line 3-3 of FIG. 2.

As shown in FIGS. 2 and 3, a solar cell 1 according to the embodiment of the invention may include a semiconductor substrate 110, an anti-reflection layer 130, an emitter region 121, a back surface field (BSF) region 172, a plurality of first electrodes C141, a plurality of second electrodes C142, a first auxiliary electrode P141, and a second auxiliary electrode P142.

The anti-reflection layer 130 and the back surface field region 172 may be omitted in the embodiment of the invention. The solar cell 1 according to the embodiment of the invention may further include a front surface field region positioned between the anti-reflection layer 130 and the semiconductor substrate 110, on which light is incident. The front surface field region is an impurity region which is more heavily doped than the semiconductor substrate 110 with impurities of the same conductive type as the semiconductor substrate 110.

Hereinafter, the embodiment of the invention describes the solar cell including the anti-reflection layer 130 and the back surface field region 172 as an example as shown in FIGS. 2 and 3.

The semiconductor substrate 110 may be a semiconductor substrate formed of silicon containing impurities of a first conductive type, for example, an n-type, though not required. The semiconductor substrate 110 may be formed by doping a wafer formed of silicon material with impurities of the first conductive type.

A front surface of the semiconductor substrate 110 may be textured to form a textured surface corresponding to an uneven surface having a plurality of uneven portions or having uneven characteristics. The anti-reflection layer 130 may be positioned on the front surface of the semiconductor substrate 110 and may have one layer or a plurality of layers. The anti-reflection layer 130 may be formed of hydrogenated silicon nitride (SiNx:H). Other materials may be used. The front surface field region may be additionally formed at the front surface of the semiconductor substrate 110.

The emitter region 121 may be positioned to be separated from one another inside a back surface opposite the front surface of the semiconductor substrate 110 and may extend parallel with one another. Namely, the emitter region 121 may be in plural. The plurality of emitter regions 121 may be of a second conductive type (for example, p-type) opposite the first conductive type (for example, n-type) of the semiconductor substrate 110.

The plurality of emitter regions 121 may heavily contain impurities of the second conductive type (for example, p-type) opposite the first conductive type (for example, n-type) of the semiconductor substrate 110 formed of crystalline silicon and may be formed through a diffusion process.

The plurality of back surface field regions 172 may be positioned inside the back surface of the semiconductor substrate 110. The plurality of back surface field regions 172 may be positioned to be separated from one another in a direction parallel to the emitter regions 121 and may extend in the same direction as the emitter regions 121. Thus, as shown in FIGS. 2 and 3, the plurality of emitter regions 121 and the plurality of back surface field regions 172 may be alternately positioned at the back surface of the semiconductor substrate 110.

Each back surface field region 172 may be a region (for example, an $n^{++}$-type region) which is more heavily doped than the semiconductor substrate 110 with impurities of the same conductive type as the semiconductor substrate 110. The plurality of back surface field regions 172 may heavily contain impurities (for example, $n^{++}$-type impurities) of the same conductive type as the semiconductor substrate 110 formed of crystalline silicon and may be formed through the diffusion process.

The plurality of first electrodes C141 are physically and electrically connected to the plurality of emitter regions 121, respectively, and extend along the plurality of emitter regions 121.

Accordingly, when the emitter regions 121 are formed along a first direction, the first electrodes C141 may be formed along the first direction. Further, when the emitter regions 121 are formed along a second direction, the first electrodes C141 may be formed along the second direction.

The plurality of second electrodes C142 are physically and electrically connected to the semiconductor substrate 110 through the plurality of back surface field regions 172 and extend along the plurality of back surface field regions 172.

The first electrodes C141 and the second electrodes C142 are physically and electrically separated from each other on the back surface of the semiconductor substrate 110.

Accordingly, when the first electrodes C141 are formed in the first direction, the second electrodes C142 may be separated from the first electrodes C141 and may be formed along the first direction. Further, when the first electrodes C141 are formed in the second direction, the second electrodes C142 may be separated from the first electrodes C141 and may be formed in the second direction.

In the embodiment disclosed herein, a width of the first electrode C141 may be equal to or different from a width of the second electrode C142.

The first electrode C141 formed on the emitter region 121 collects carriers (for example, holes) moving to the emitter region 121, and the second electrode C142 formed on the back surface field region 172 collects carriers (for example, electrons) moving to the back surface field region 172.

The first auxiliary electrode P141 may be electrically connected to back surfaces of the plurality of first electrodes C141. Namely, the first auxiliary electrode P141 may be formed in the plural. Alternatively, the first auxiliary electrode P141 may be formed as a sheet electrode.

When the plurality of first auxiliary electrodes P141 are provided, the first auxiliary electrodes P141 may be formed in the same direction as the first electrodes C141 and also may be formed in a direction crossing the first electrodes C141.

The first auxiliary electrode P141 and the first electrode C141 may be electrically connected to each other in an overlap portion therebetween.

The second auxiliary electrode P142 may be electrically connected to back surfaces of the plurality of second electrodes C142.

Namely, the second auxiliary electrode P142 may be formed in the plural. Alternatively, the second auxiliary electrode P142 may be formed as a sheet electrode.

When the plurality of second auxiliary electrodes P142 are provided, the second auxiliary electrodes P142 may be formed in the same direction as the second electrodes C142 and also may be formed in a direction crossing the second electrodes C142.

The second auxiliary electrode P142 and the second electrode C142 may be electrically connected to each other in an overlap portion therebetween.

The first auxiliary electrode P141 may have a first auxiliary electrode pad at its end for the connection of the interconnector IC, and the second auxiliary electrode P142 may have a second auxiliary electrode pad at its end for the connection of the interconnector IC. This is described in detail with reference to FIG. 4.

The first auxiliary electrode P141 and the second auxiliary electrode P142 may be formed of at least one of Cu, Au, Ag, and Al.

The first auxiliary electrode P141 may be electrically connected to the first electrode C141 through a first conductive adhesive CA1, and the second auxiliary electrode P142 may be electrically connected to the second electrode C142 through the first conductive adhesive CA1.

A material of the first conductive adhesive CA1 is not particularly limited as long as it is a conductive material. It is preferable, but not required, that the first conductive adhesive CA1 uses a conductive material having a melting point at a relatively low temperature of about 130° C. to 250° C. For example, a solder paste, a conductive adhesive including metal particles, carbon nanotube (CNT), conductive particles containing carbon, a wire needle, etc. may be used.

In the embodiment disclosed herein, the first conductive adhesive CA1 is not indispensable and may be omitted depending on the manufacturing method. However, in the following description, the embodiment of the invention, in which the first conductive adhesive CA1 is provided, is described as an example, except under special circumstances.

An insulating layer IL may be positioned between the first electrode C141 and the second electrode C142 and between the first auxiliary electrode P141 and the second auxiliary electrode P142, thereby preventing the short circuit.

FIGS. 2 and 3 show the overlap between the first electrode C141 and the first auxiliary electrode P141 and the overlap between the second electrode C142 and the second auxiliary electrode P142, as an example. However, the first electrode C141 may overlap the second auxiliary electrode P142, and the second electrode C142 may overlap the first auxiliary electrode P141. In this instance, the insulating layer IL for preventing the short circuit may be positioned between the first electrode C141 and the second auxiliary electrode P142 and between the second electrode C142 and the first auxiliary electrode P141.

The insulating layer IL may be formed of at least one of an epoxy resin, ethylene vinyl acetate (EVA), and a polymer. Other materials may be used for the insulating layer IL. Further, the insulating layer IL is not indispensable and may be omitted depending on the manufacturing method. However, in the following description, the embodiment of the invention, in which the insulating layer IL is provided, is described as an example, except under special circumstances.

Further, FIGS. 2 and 3 show the plurality of first auxiliary electrodes P141 and the plurality of second auxiliary electrodes P142, as an example. However, each of the first auxiliary electrode P141 and the second auxiliary electrode P142 may be formed as a sheet electrode.

In FIGS. 2 and 3, the first auxiliary electrode P141 may include a first auxiliary electrode pad connected to the interconnector IC, and the second auxiliary electrode P142 may include a second auxiliary electrode pad connected to the interconnector IC.

In the solar cell according to the embodiment of the invention, a thickness T2 of each of the first auxiliary electrode P141 and the second auxiliary electrode P142 may be greater than a thickness T1 of each of the first electrode C141 and the second electrode C142. For example, the thickness T2 of each of the first auxiliary electrode P141 and the second auxiliary electrode P142 may be about 10 μm to 900 μm.

When the thickness T2 of each of the first auxiliary electrode P141 and the second auxiliary electrode P142 is equal to or greater than about 10 μm, a minimum resistance may be properly secured. Further, when the thickness T2 of each of the first auxiliary electrode P141 and the second auxiliary electrode P142 is equal to or less than about 900 μm, an unnecessary increase in the thickness T2 may be prevented in a state where the minimum resistance is properly secured, thereby reducing the manufacturing cost.

When the thickness T2 of each of the first auxiliary electrode P141 and the second auxiliary electrode P142 is greater than the thickness T1 of each of the first electrode C141 and the second electrode C142, a process time required to manufacture the solar cell may be further reduced, and a thermal expansion stress of the semiconductor substrate 110 may be further reduced than when the first electrode C141 and the second electrode C142 are directly formed on the back surface of the semiconductor substrate 110. Hence, the efficiency of the solar cell may be further improved.

This is described in detail below.

In general, the emitter region 121, the back surface field region 172, the first electrode C141 connected to the emitter region 121, and the second electrode C142 connected to the back surface field region 172, which are formed on the back surface of the semiconductor substrate 110, may be formed through a semiconductor process. In the semiconductor process, the first electrode C141 and the second electrode C142 may directly contact the back surface of the semiconductor substrate 110 or may be very close to the back surface of the semiconductor substrate 110. Further, the first electrode C141 and the second electrode C142 may be generally formed through a plating method, a physical vapor deposition (PVD) method, or a thermal process of a high temperature.

In this instance, the first and second electrodes C141 and C142 have to be sufficiently thick, so as to sufficiently reduce resistances of the first and second electrodes C141 and C142.

However, when thicknesses of the first and second electrodes C141 and C142 increase, a thermal expansion coefficient of the first and second electrodes C141 and C142 containing a conductive metal material may be excessively greater than a thermal expansion coefficient of the semiconductor substrate 110.

Accordingly, when the first and second electrodes C141 and C142 contract during the process for forming the first and second electrodes C141 and C142 on the back surface of the semiconductor substrate 110 through the thermal process of the high temperature, the semiconductor substrate 110 cannot stand a thermal expansion stress. Hence, a fracture or a crack may be generated in the semiconductor substrate 110. As a result, yield of the manufacturing process of the solar cell may be reduced, and the efficiency of the solar cell may be reduced.

Further, when the first electrode C141 or the second electrode C142 is formed using the plating method or the PVD method, a growth speed of the first electrode C141 or the second electrode C142 may be very low. Hence, the manufacturing time of the solar cell may excessively increase.

On the other hand, in the solar cell 1 according to the embodiment of the invention, the first and second auxiliary electrodes P141 and P142 are formed on the back surfaces of the first and second electrodes C141 and C142 in a state where the first and second electrodes C141 and C142 each having the relatively small thickness T1 are formed on the back surface of the semiconductor substrate 110. Hence, generation of the fracture or the crack in the semiconductor substrate 110 may be reduced. As a result, the process yield may be improved. This is described in detail below.

The solar cell 1 according to the embodiment of the invention thus manufactured may collect holes through the first auxiliary electrodes P141 and may collect electrons through the second auxiliary electrodes P142, and thus may use electric power generated in the solar cells as electric power of an external device through an external circuit device.

An operation of the back contact solar cell having the above-described structure is described below.

When light irradiated onto the solar cell 1 is incident on the semiconductor substrate 110 through the anti-reflection layer 130, a plurality of electron-hole pairs are generated in the semiconductor substrate 110 by light energy produced based on the incident light.

The electron-hole pairs are separated into electrons and holes due to a p-n junction of the semiconductor substrate 110 and the emitter regions 121. The electrons move to the n-type back surface field regions 172, and the holes move to the p-type emitter regions 121. The electrons moving to the back surface field regions 172 are collected by the second auxiliary electrodes P142, and the holes moving to the emitter regions 121 are collected by the first auxiliary electrodes P141. When the first auxiliary electrodes P141 are connected to the second auxiliary electrodes P142 using conductive wires, current flows therein to thereby enable use of the current for electric power.

So far, the embodiment of the invention described that the semiconductor substrate 110 is a single crystal silicon semiconductor substrate and the emitter regions 121 and the back surface field regions 172 are formed through a diffusion process, as an example.

However, on the contrary, the embodiment of the invention may be equally applied to a back contact hybrid solar cell, in which the emitter region 121 and the back surface field region 172 are formed of amorphous silicon, or a metal wrap through (MWT) solar cell, in which the emitter region 121 is formed on the front surface of the semiconductor substrate 110 and is connected to the first electrodes C141 formed on the back surface of the semiconductor substrate 110 through a plurality of via holes of the semiconductor substrate 110.

Figure 4:
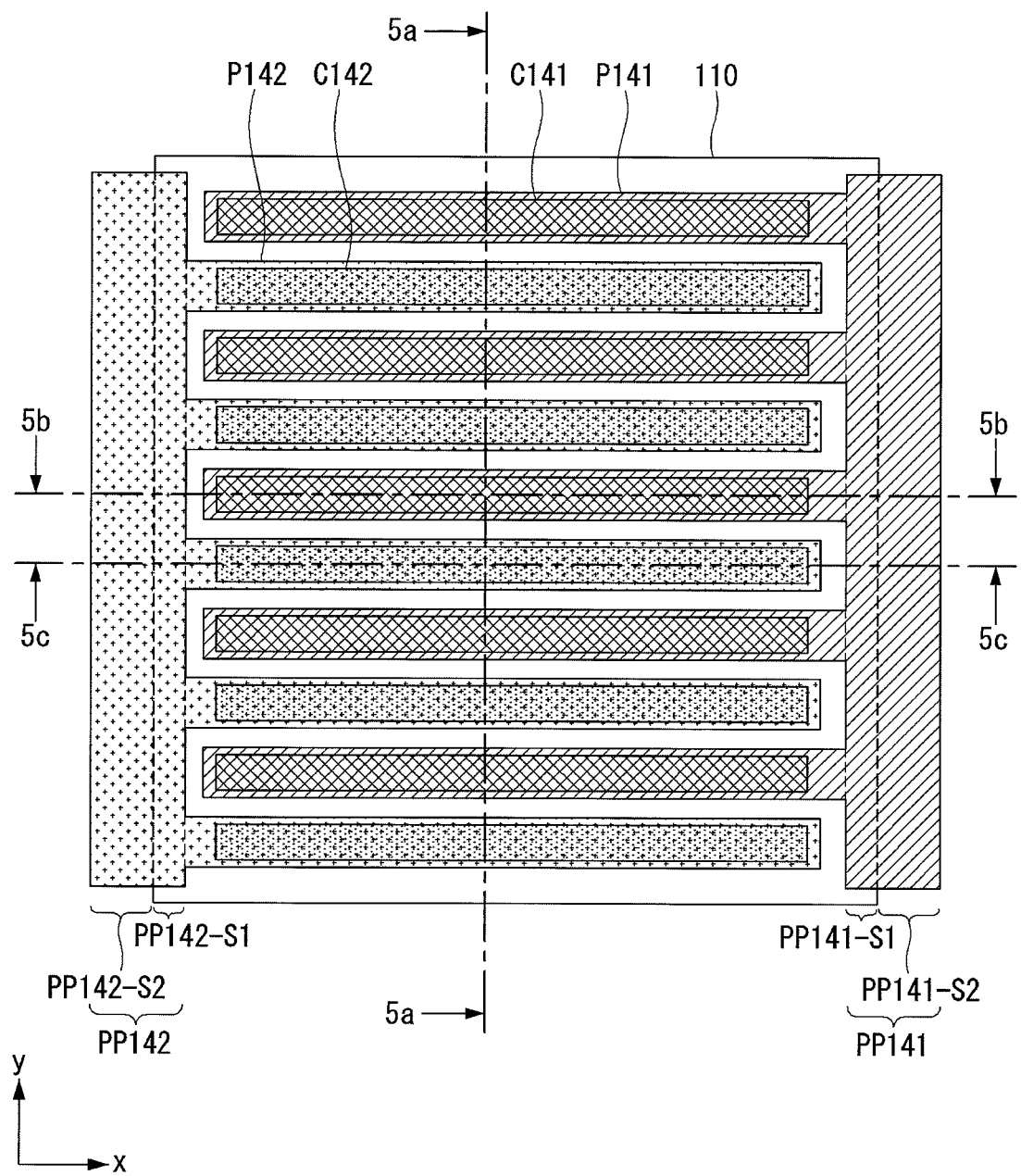
FIGS. 4 to 5C illustrate a first embodiment, in which a first auxiliary electrode and a second auxiliary electrode are formed on a back surface of a semiconductor substrate of each solar cell included in the solar cell module shown in FIG. 1.
Figure 5A:
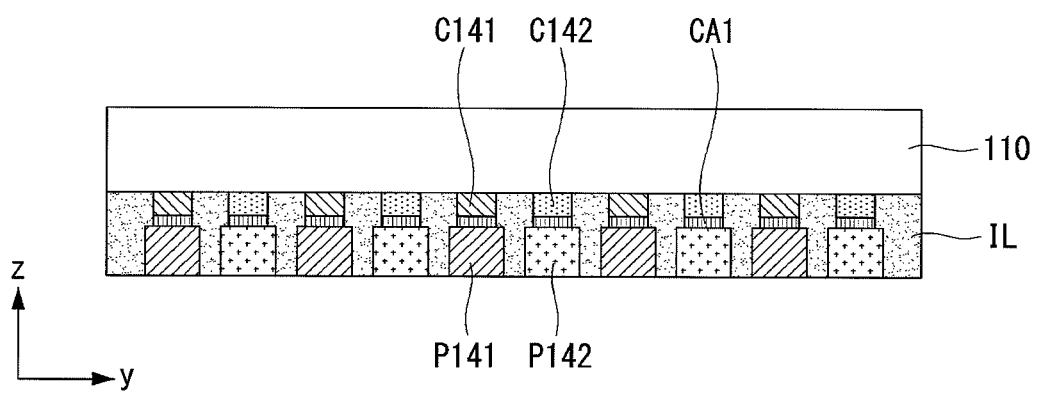
Figure 5B:
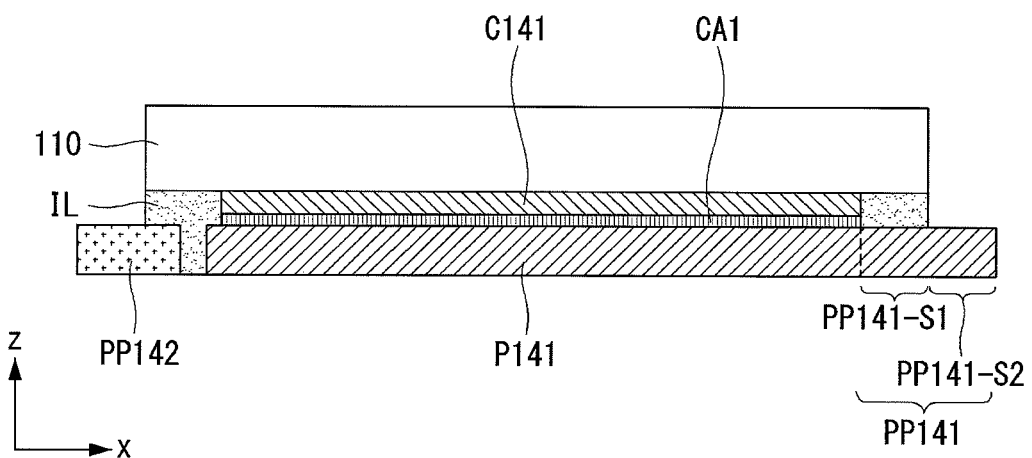
Figure 5C:
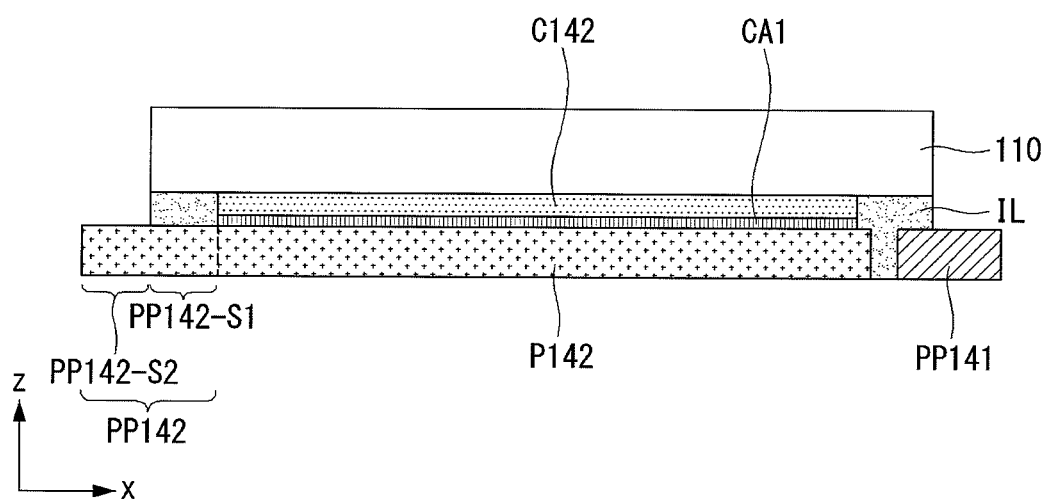

FIGS. 4 to 5C illustrate a first embodiment, in which the first auxiliary electrode and the second auxiliary electrode are formed on the back surface of the semiconductor substrate of each solar cell included in the solar cell module shown in FIG. 1.

Description of structures and components identical or equivalent to those described above may be briefly made or may be entirely omitted in FIGS. 4 to 5C.

More specifically, FIG. 4 shows the first auxiliary electrode P141 connected to the first electrode C141 and the second auxiliary electrode P142 connected to the second electrode C142 when viewed from the back surface of the semiconductor substrate 110. FIG. 5A is a cross-sectional view taken along line 5a-5a of FIG. 4; FIG. 5B is a cross-sectional view taken along line 5b-5b of FIG. 4; and FIG. 5C is a cross-sectional view taken along line 5c-5c of FIG. 4.

As shown in FIG. 4, the plurality of first electrodes C141 and the plurality of second electrodes C142 may be formed on the back surface of the semiconductor substrate 110 to be separated from each other and may extend in a first direction x (for example, x-axis direction). Further, the plurality of first auxiliary electrodes P141 and the plurality of second auxiliary electrodes P142 may be separated from each other and may extend in the first direction x. The plurality of first auxiliary electrodes P141 and the plurality of second auxiliary electrodes P142 may overlap and may be connected to the back surfaces of the plurality of first electrodes C141 and the back surfaces of the plurality of second electrodes C142, respectively.

The first auxiliary electrode P141 may have a first auxiliary electrode pad PP141 at its end for the connection of the interconnector IC, and the second auxiliary electrode P142 may have a second auxiliary electrode pad PP142 at its end for the connection of the interconnector IC.

The first auxiliary electrode pad PP141 may extend in a second direction y (for example, y-axis direction) and may be connected to the ends of the plurality of first auxiliary electrodes P141. The second auxiliary electrode pad PP142 may extend in the second direction y and may be connected to the ends of the plurality of second auxiliary electrodes P142.

In the embodiment disclosed herein, the first auxiliary electrodes P141 may be separated from the second auxiliary electrode pad PP142, and the second auxiliary electrodes P142 may be separated from the first auxiliary electrode pad PP141.

Accordingly, the plurality of first auxiliary electrodes P141 and the first auxiliary electrode pad PP141 may have a comb shape, and the plurality of second auxiliary electrodes P142 and the second auxiliary electrode pad PP142 may have a comb shape. In this instance, the two combs may be positioned opposite each other.

The first auxiliary electrode pad PP141 may be formed in the second direction y at one end of both ends of the back surface of the semiconductor substrate 110 in the first direction x, and the second auxiliary electrode pad PP142 may be formed in the second direction y at the other end. An interconnector IC for connecting the solar cells or a ribbon for connecting cell strings of the plurality of solar cells, which are connected in series, may be electrically connected to the first auxiliary electrode pad PP141 and the second auxiliary electrode pad PP142.

A thickness of each of the first auxiliary electrode pad PP141 and the second auxiliary electrode pad PP142 may be equal to or different from a thickness T2 of each of the first auxiliary electrode P141 and the second auxiliary electrode P142.

As shown in FIGS. 4, 5B, and 5C, the first auxiliary electrode pad PP141 may include a first area PP141-S1 overlapping the semiconductor substrate 110 and a second area PP141-S2 not overlapping the semiconductor substrate 110, and the second auxiliary electrode pad PP142 may include a first area PP142-S1 overlapping the semiconductor substrate 110 and a second area PP142-S2 not overlapping the semiconductor substrate 110.

The first auxiliary electrode pad PP141 may partially overlap the semiconductor substrate 110 and may be exposed to the outside of the semiconductor substrate 110, so as to secure a space where its first area PP141-S1 can be connected to the plurality of first auxiliary electrodes P141 and its second area PP141-S2 can be connected to the interconnector IC.

Further, the second auxiliary electrode pad PP142 may partially overlap the semiconductor substrate 110 and may be exposed to the outside of the semiconductor substrate 110, so as to secure a space where its first area PP142-S1 can be connected to the plurality of second auxiliary electrodes P142 and its second area PP142-S2 can be connected to the interconnector IC.

Because the first auxiliary electrode pad PP141 and the second auxiliary electrode pad PP142 according to the embodiment of the invention respectively include the second areas PP141-S2 and PP142-S2 exposed to the outside of the semiconductor substrate 110, the first auxiliary electrode pad PP141 and the second auxiliary electrode pad PP142 may be more easily connected to the interconnector IC. Further, when the interconnector IC is connected to the solar cell, the thermal expansion stress of the semiconductor substrate 110 may be minimized.

Accordingly, the thermal expansion stress applied to the semiconductor substrate 110 of the solar cell according to the embodiment of the invention may be minimized in the process for manufacturing the cell string of the plurality of solar cells to manufacture the solar cell module.

However, the second areas PP141-S2 and PP142-S2 of the first auxiliary electrode pad PP141 and the second auxiliary electrode pad PP142 are not indispensable and may be omitted depending on the connection form of the interconnector IC.

As shown in FIG. 5A, the first electrode C141 and the first auxiliary electrode P141 formed on the back surface of the semiconductor substrate 110 may be electrically connected to each other through the first conductive adhesive CA1 in an overlap portion therebetween. Further, the second electrode C142 and the second auxiliary electrode P142 formed on the back surface of the semiconductor substrate 110 may be electrically connected to each other through the first conductive adhesive CA1 in an overlap portion therebetween.

The insulating layer IL may be filled in a space between the first electrode C141 and the second electrode C142 and a space between the first auxiliary electrode P141 and the second auxiliary electrode P142.

As shown in FIG. 5B, the insulating layer IL may be filled in a space between the first auxiliary electrode P141 and the second electrode C142. As shown in FIG. 5C, the insulating layer IL may be filled in a space between the second auxiliary electrode P142 and the first electrode C141.

In each solar cell included in the solar cell module according to the embodiment of the invention, an insulating member is not formed on the back surfaces of the first auxiliary electrode P141 and the second auxiliary electrode P142 and may be omitted.

In other words, the insulating member, on which the first auxiliary electrode P141 and the second auxiliary electrode P142 are formed, may be used to connect the first auxiliary electrode P141 and the second auxiliary electrode P142 to the first electrode C141 and the second electrode C142 formed on the back surface of the semiconductor substrate 110, for the easy manufacturing process of the solar cell module.

However, in the solar cell module according to the embodiment of the invention, the insulating member may be removed in the process for forming one solar cell. As described above, when the insulating member is removed, the weight of the solar cell module may be reduced, and the plurality of cell strings may be easily connected to one another through the ribbon in the manufacturing process of the solar cell module.

Accordingly, as described above, the solar cell, in which the insulating member is removed, may be applied to the solar cell module according to the embodiment of the invention.

So far, the embodiment of the invention described that the first and second electrodes C141 and C142 formed on the semiconductor substrate 110 and the first and second auxiliary electrodes P141 and P142 overlap each other and are connected to each other in a direction parallel to each other. However, the first and second electrodes C141 and C142 and the first and second auxiliary electrodes P141 and P142 may overlap each other and may be connected to each other in a cross direction therebetween. This is described in detail below.

Figure 6:
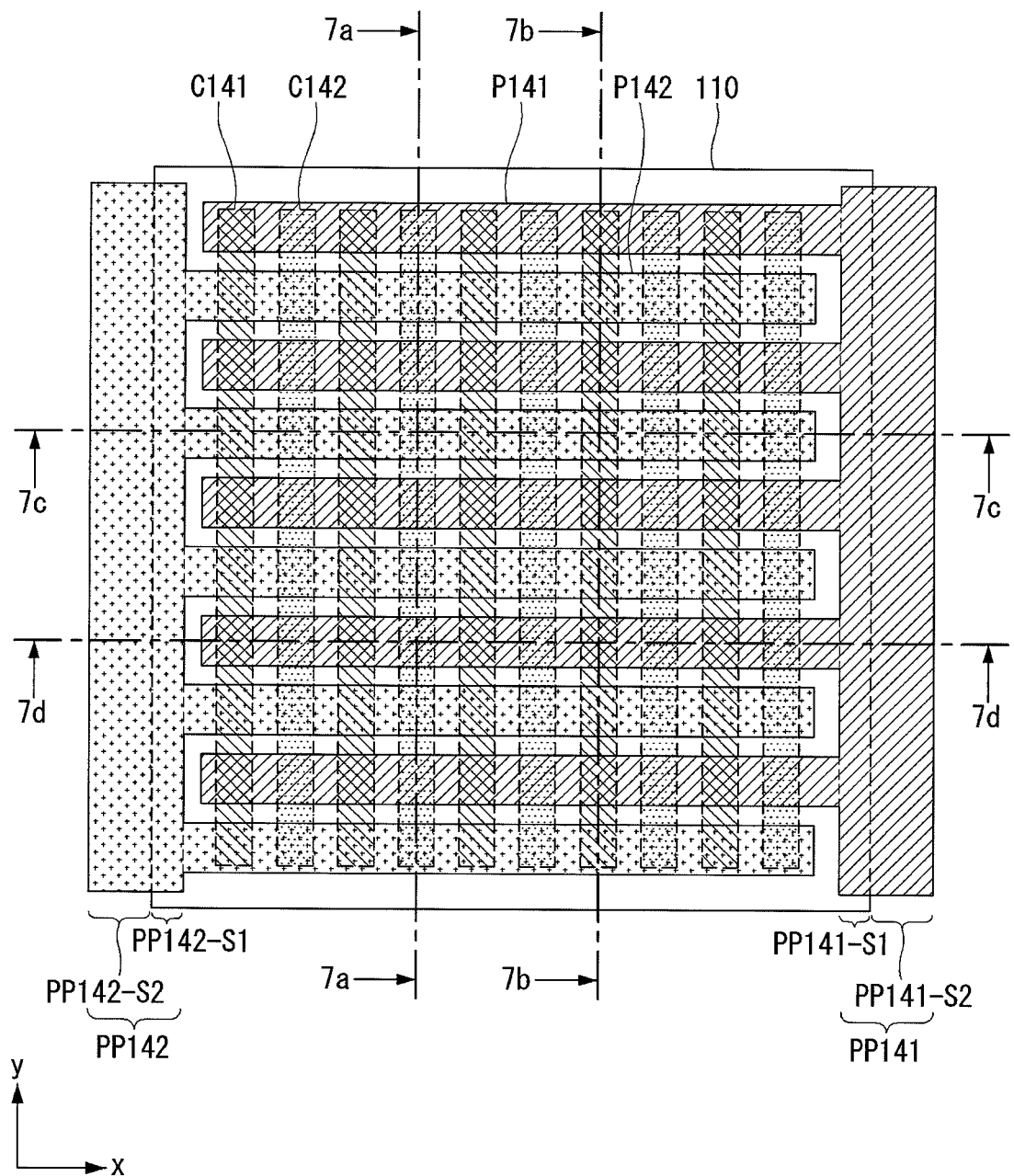
FIGS. 6 to 7D illustrate a second embodiment, in which a first auxiliary electrode and a second auxiliary electrode are formed on a back surface of a semiconductor substrate of each solar cell included in the solar cell module shown in FIG. 1.
Figure 7A:
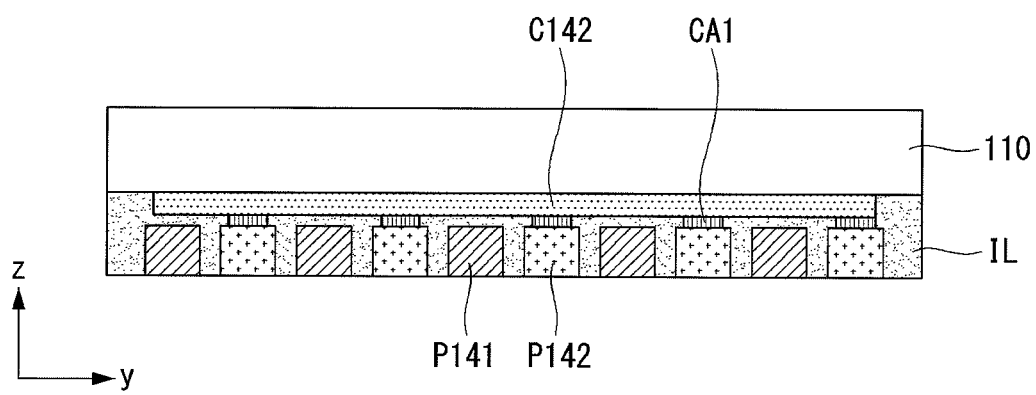
Figure 7B:
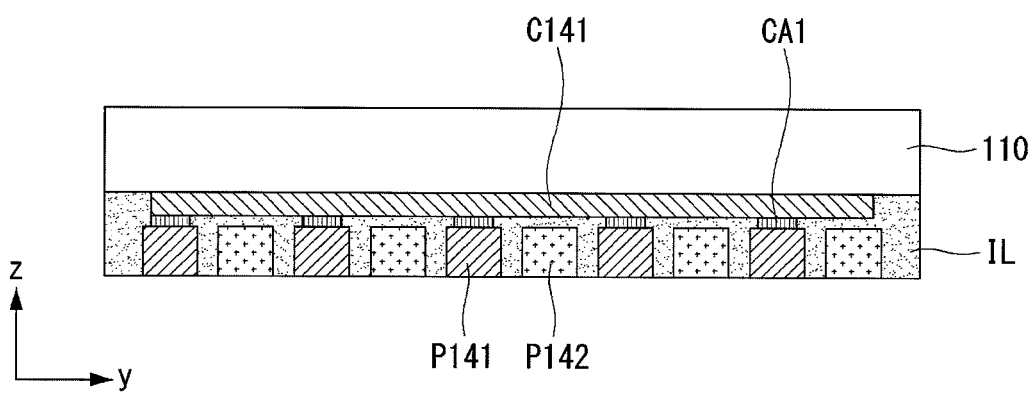
Figure 7C:
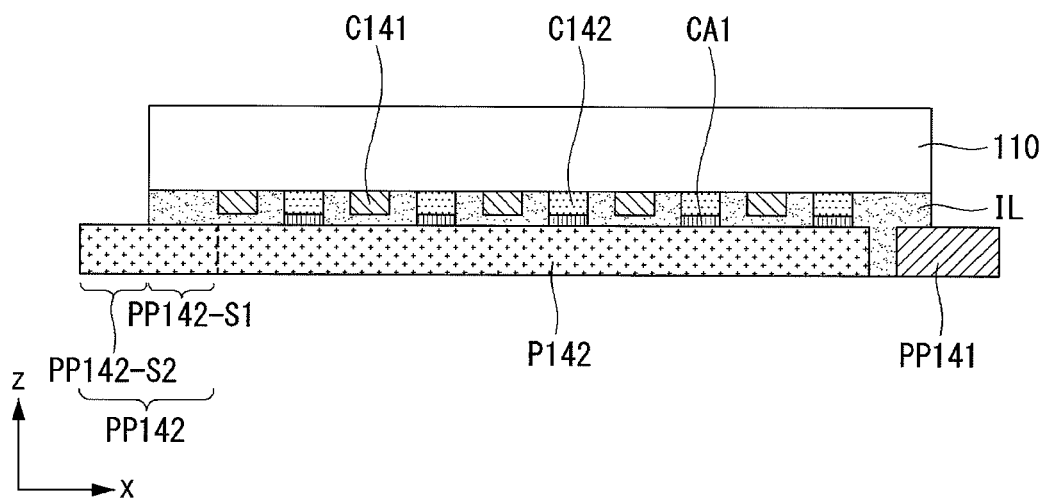
Figure 7D:
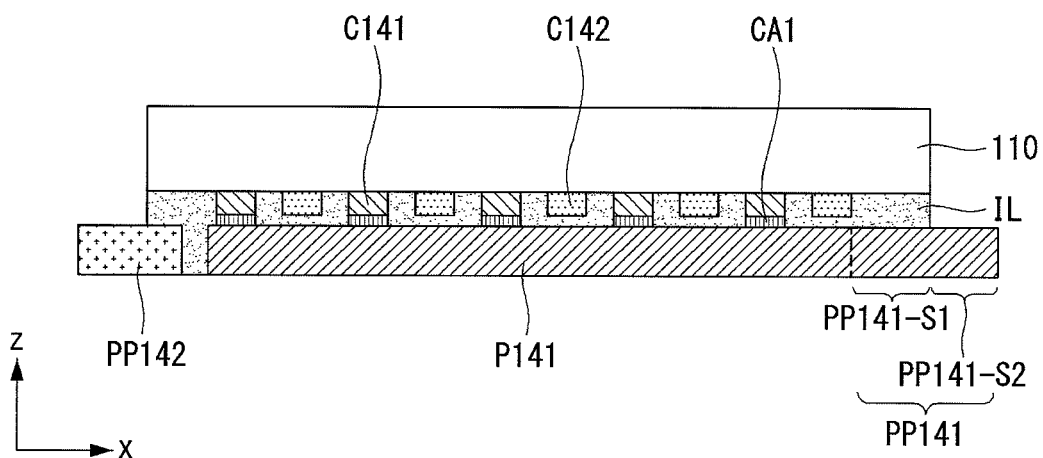

FIGS. 6 to 7D illustrate a second embodiment, in which the first auxiliary electrode and the second auxiliary electrode are formed on the back surface of the semiconductor substrate of each solar cell included in the solar cell module shown in FIG. 1.

Description of structures and components identical or equivalent to those described above may be briefly made or may be entirely omitted in FIGS. 6 to 7D.

More specifically, FIG. 6 shows the first auxiliary electrode P141, which is connected to the first electrode C141 and crosses the first electrode C141, and the second auxiliary electrode P142, which is connected to the second electrode C142 and crosses the second electrode C142, when viewed from the plane of the semiconductor substrate 110. FIG. 7A is a cross-sectional view taken along line 7a-7a of FIG. 6; FIG. 7B is a cross-sectional view taken along line 7b-7b of FIG. 6; FIG. 7C is a cross-sectional view taken along line 7c-7c of FIG. 6; and FIG. 7D is a cross-sectional view taken along line 7d-7d of FIG. 6.

As shown in FIG. 6, the plurality of first and second electrodes C141 and C142 may be separated from each other in the second direction y, and the plurality of first and second auxiliary electrodes P141 and P142 may be separated from each other in the first direction x crossing the second direction y.

Hence, the first electrodes C141, the first auxiliary electrodes P141, the second electrodes C142, and the second auxiliary electrodes P142 may form a lattice shape.

As shown in FIG. 7A, portions, in which the second electrodes C142 and the second auxiliary electrodes P142 overlap and cross each other, may be connected to one another through the first conductive adhesive CA1. Further, portions, in which the second electrodes C142 and the first auxiliary electrodes P141 overlap and cross each other, may be filled with the insulating layer IL and thus may be insulated from one another.

As shown in FIG. 7B, portions, in which the first electrodes C141 and the first auxiliary electrodes P141 overlap and cross each other, may be connected to one another through the first conductive adhesive CA1. Further, portions, in which the first electrodes C141 and the second auxiliary electrodes P142 overlap and cross each other, may be filled with the insulating layer IL and thus may be insulated from one another.

As shown in FIG. 7C, a space between the second auxiliary electrodes P142 and the first auxiliary electrode pad PP141 may be filled with the insulating layer IL. The second area of the second auxiliary electrode pad PP142 not overlapping the semiconductor substrate 110 may be exposed to the outside.

As shown in FIG. 7D, a space between the first auxiliary electrodes P141 and the second auxiliary electrode pad PP142 may be filled with the insulating layer IL. The second area of the first auxiliary electrode pad PP141 not overlapping the semiconductor substrate 110 may be exposed to the outside.

Figure 8:
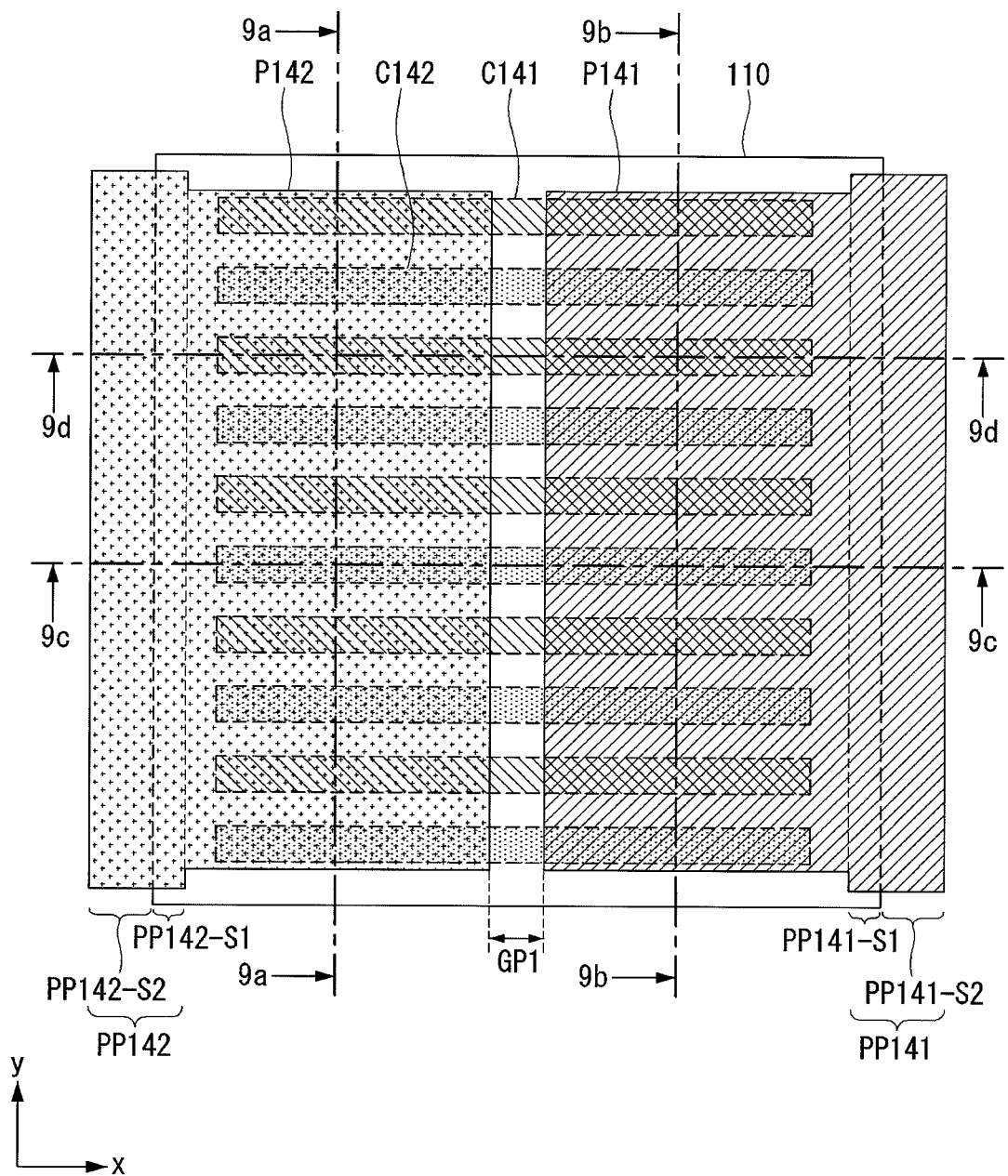
FIGS. 8 to 9D illustrate a third embodiment, in which a first auxiliary electrode and a second auxiliary electrode are formed on a back surface of a semiconductor substrate of each solar cell included in the solar cell module shown in FIG. 1.
Figure 9A:
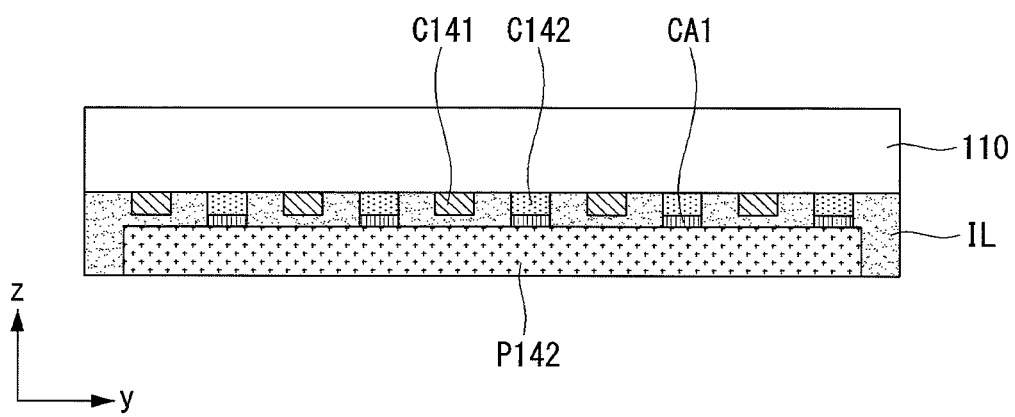
Figure 9B:
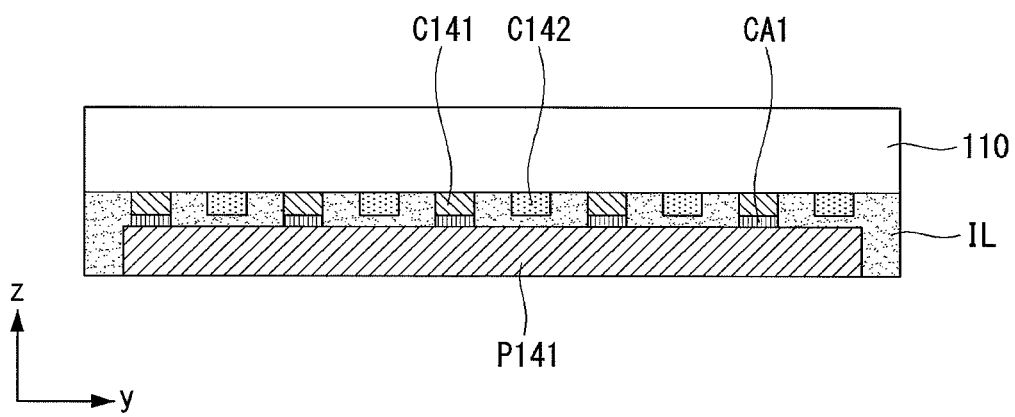
Figure 9C:
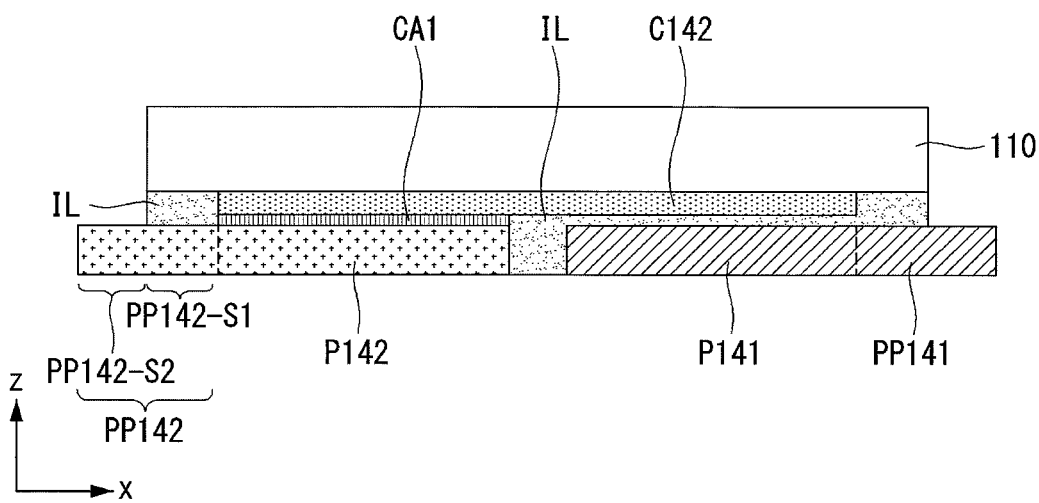
Figure 9D:
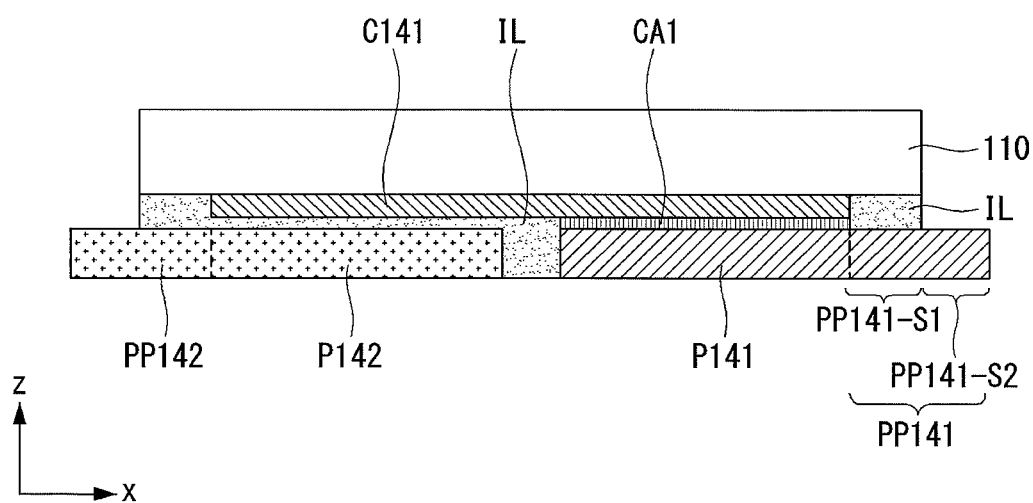

FIGS. 8 to 9D illustrate a third embodiment, in which the first auxiliary electrode and the second auxiliary electrode are formed on the back surface of the semiconductor substrate of each solar cell included in the solar cell module shown in FIG. 1.

Description of structures and components identical or equivalent to those described above may be briefly made or may be entirely omitted in FIGS. 8 to 9D.

More specifically, FIG. 8 shows the first auxiliary electrode P141 connected to the first electrode C141 and the second auxiliary electrode P142 connected to the second electrode C142 when each of the first and second auxiliary electrodes P141 and P142 is formed as a sheet electrode when viewed from the back surface of the semiconductor substrate 110. FIG. 9A is a cross-sectional view taken along line 9a-9a of FIG. 8; FIG. 9B is a cross-sectional view taken along line 9b-9b of FIG. 8; FIG. 9C is a cross-sectional view taken along line 9c-9c of FIG. 8; and FIG. 9D is a cross-sectional view taken along line 9d-9d of FIG. 8.

As shown in FIG. 8, the plurality of first and second electrodes C141 and C142 may extend in the first direction x. Further, each of the first and second auxiliary electrodes P141 and P142 may be formed as a sheet electrode, and the first and second auxiliary electrodes P141 and P142 may be separated from each other by a distance GP1 in the second direction y.

The first auxiliary electrode P141 may be formed by attaching a metal layer in a state where the first conductive adhesive CA1 is formed on the first electrode C141, which will overlap the first auxiliary electrode P141, and the insulating layer IL is formed on the second electrode C142.

Further, the second auxiliary electrode P142 may be formed by attaching a metal layer in a state where the first conductive adhesive CA1 is formed on the second electrode C142, which will overlap the second auxiliary electrode P142, and the insulating layer IL is formed on the first electrode C141.

As shown in FIG. 9A, in a formation portion of the second auxiliary electrode P142 shown in FIG. 8, the second auxiliary electrode P142 may be electrically connected to the second electrode C142 through the first conductive adhesive CA1 and may be insulated from the first electrodes C141 through the insulating layer IL.

As shown in FIG. 9B, in a formation portion of the first auxiliary electrode P141 shown in FIG. 8, the first auxiliary electrode P141 may be electrically connected to the first electrodes C141 through the first conductive adhesive CA1 and may be insulated from the second electrodes C142 through the insulating layer IL.

As shown in FIG. 9C, an overlap portion between the second electrode C142 and the second auxiliary electrode P142 may be electrically connected to the second auxiliary electrode P142 through the first conductive adhesive CA1. Further, an overlap portion between the second electrode C142 and the first auxiliary electrode P141 may be insulated from the first auxiliary electrode P141 through the insulating layer IL.

As shown in FIG. 9D, an overlap portion between the first electrode C141 and the first auxiliary electrode P141 may be electrically connected to the first auxiliary electrode P141 through the first conductive adhesive CA1. Further, an overlap portion between the first electrode C141 and the second auxiliary electrode P142 may be insulated from the second auxiliary electrode P142 through the insulating layer IL.

In the third embodiment of the invention, the insulating layer IL may be formed between the first auxiliary electrode P141 and the second auxiliary electrode P142.

Figure 10:
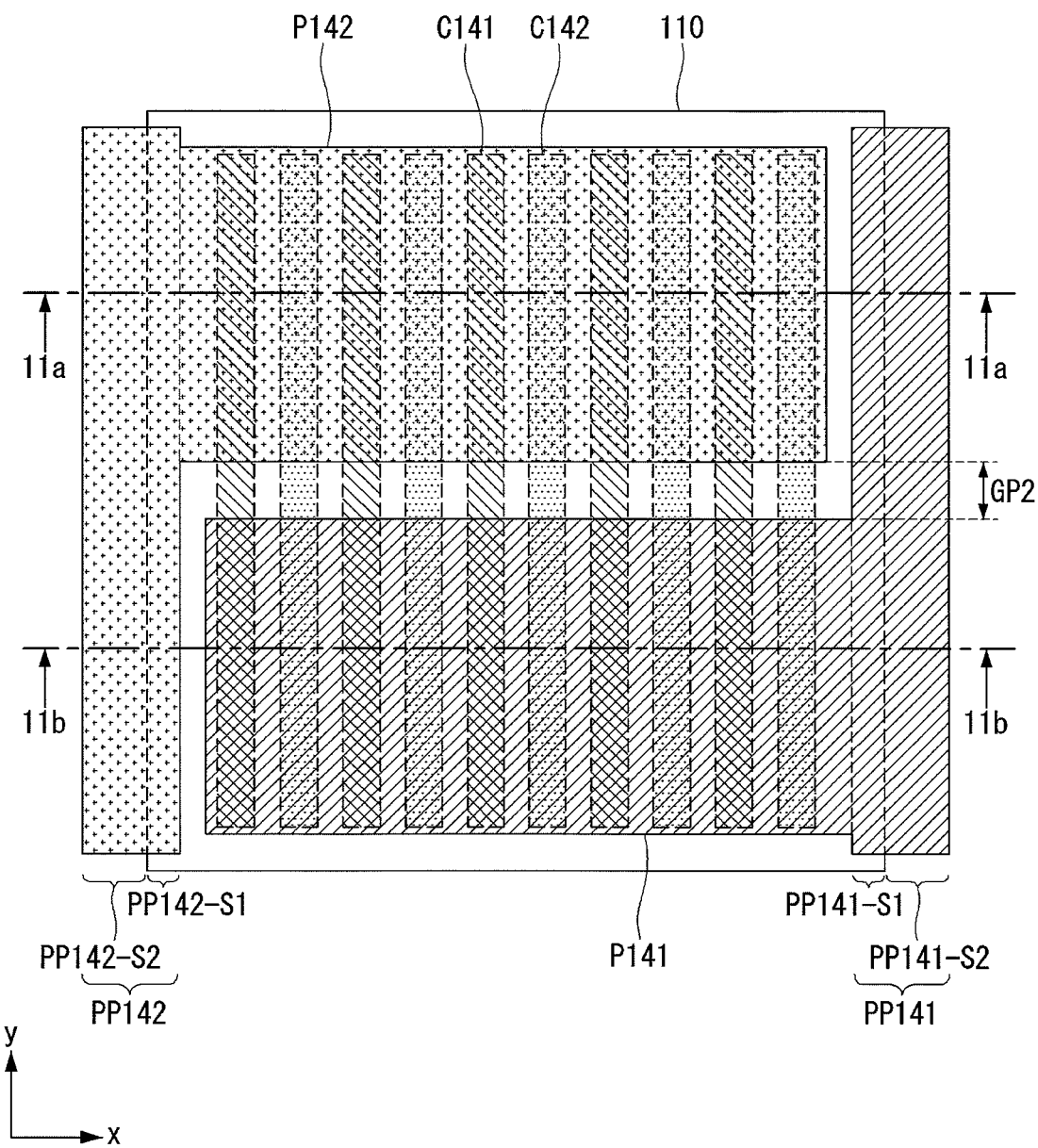
FIGS. 10 to 11B illustrate a fourth embodiment, in which a first auxiliary electrode and a second auxiliary electrode are formed on a back surface of a semiconductor substrate of each solar cell included in the solar cell module shown in FIG. 1.
Figure 11A:
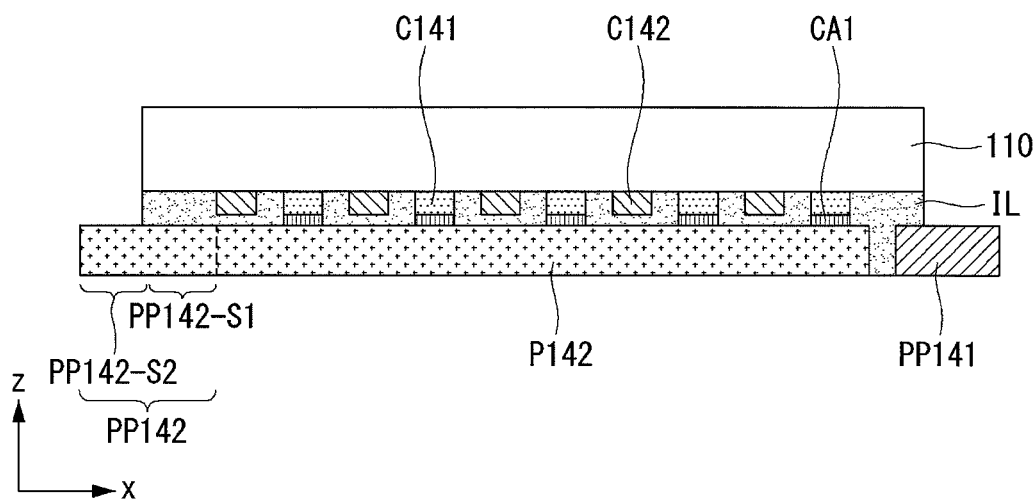
Figure 11B:
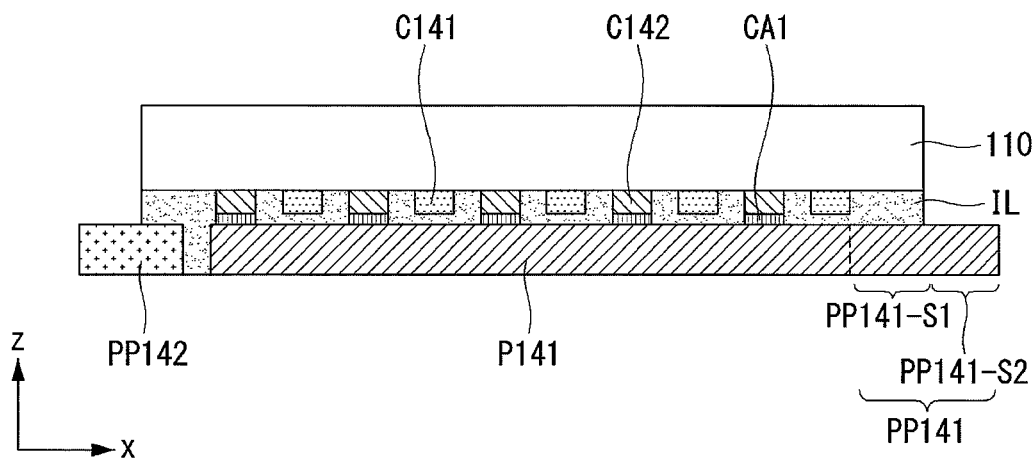

FIGS. 10 to 11B illustrate a fourth embodiment, in which the first auxiliary electrode and the second auxiliary electrode are formed on the back surface of the semiconductor substrate of each solar cell included in the solar cell module shown in FIG. 1.

Description of structures and components identical or equivalent to those described above may be briefly made or may be entirely omitted in FIGS. 10 to 11B.

More specifically, FIG. 10 shows the first auxiliary electrode P141 connected to the first electrode C141 and the second auxiliary electrode P142 connected to the second electrode C142 when each of the first and second auxiliary electrodes P141 and P142 is formed as a sheet electrode when viewed from the back surface of the semiconductor substrate 110. FIG. 11A is a cross-sectional view taken along line 11a-11a of FIG. 10, and FIG. 11B is a cross-sectional view taken along line 11b-11b of FIG. 10.

As shown in FIG. 10, the first electrodes C141 and the second electrodes C142 may be formed on the back surface of the semiconductor substrate 110 in the second direction y. Further, the first auxiliary electrode P141 and the second auxiliary electrode P142 may be formed as a sheet electrode crossing the first electrodes C141 and the second electrodes C142 along the first direction x.

The first auxiliary electrode P141 and the second auxiliary electrode P142 may be positioned to be separated from each other by a distance GP2 in the middle of the semiconductor substrate 110.

The first auxiliary electrode P141 may be formed by attaching a metal layer in a state where the first conductive adhesive CA1 is formed on the first electrode C141, which will overlap the first auxiliary electrode P141, and the insulating layer IL is formed on the second electrode C142.

Further, the second auxiliary electrode P142 may be formed by attaching a metal layer in a state where the first conductive adhesive CA1 is formed on the second electrode C142, which will overlap the second auxiliary electrode P142, and the insulating layer IL is formed on the first electrode C141.

As shown in FIG. 11A, in a formation portion of the second auxiliary electrode P142 shown in FIG. 10, the second auxiliary electrode P142 may be electrically connected to the second electrode C142 through the first conductive adhesive CA1 and may be insulated from the first electrodes C141 through the insulating layer IL.

As shown in FIG. 11B, in a formation portion of the first auxiliary electrode P141 shown in FIG. 10, the first auxiliary electrode P141 may be electrically connected to the first electrodes C141 through the first conductive adhesive CA1 and may be insulated from the second electrodes C142 through the insulating layer IL.

As described above, when each of the first auxiliary electrode P141 and the second auxiliary electrode P142 is formed as one sheet electrode, an alignment process may be very easily performed because the precise alignment process is not required. Hence, manufacturing time of the solar cell may be further reduced.

So far, the embodiment of the invention described the solar cells of the solar cell module shown in FIG. 1. Hereinafter, the connection of the solar cells of the solar cell module through the interconnector is described.

Figure 12:
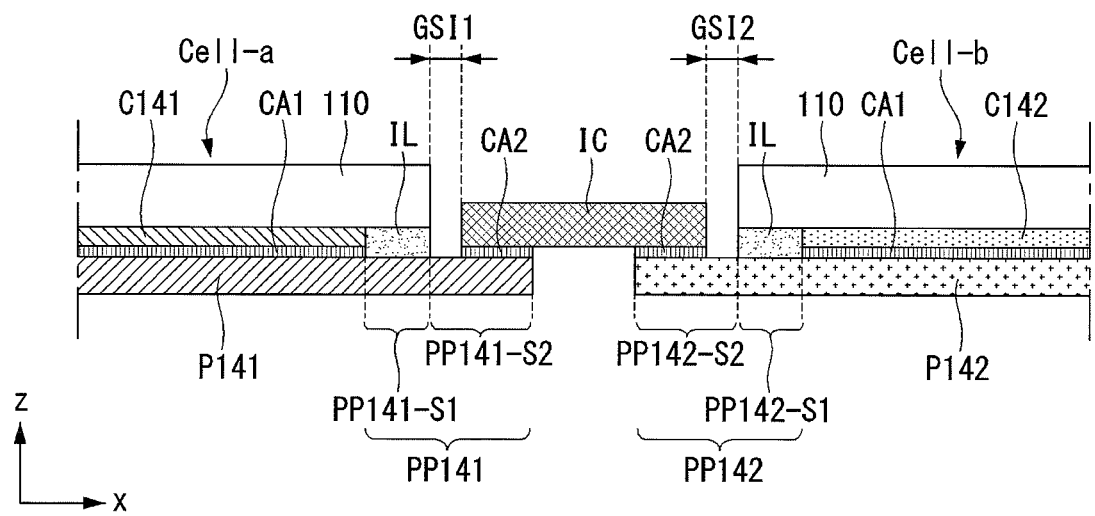
FIGS. 12 to 14 illustrate various structures, in which solar cells of the solar cell module shown in FIG. 1 are connected through an interconnector.
Figure 13:
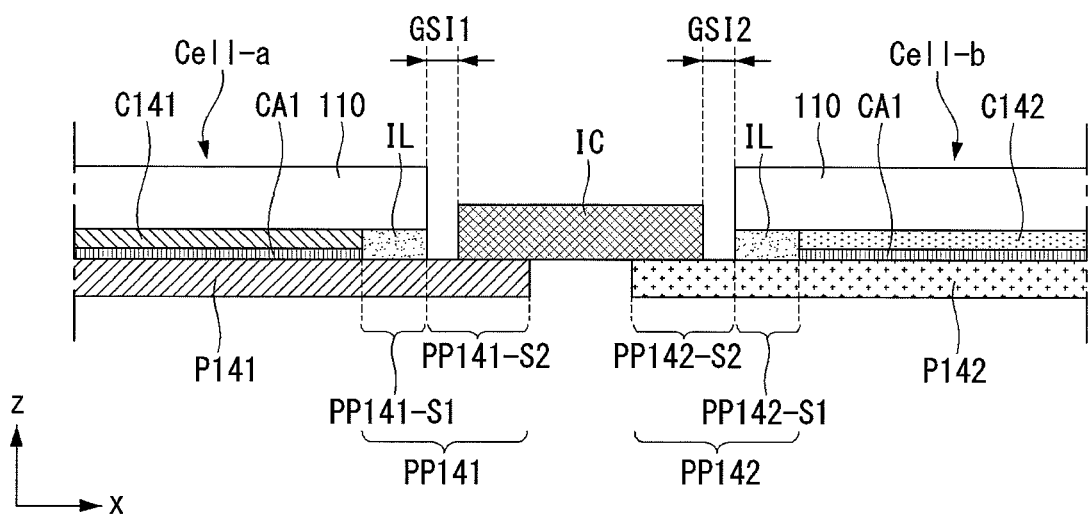
Figure 14:
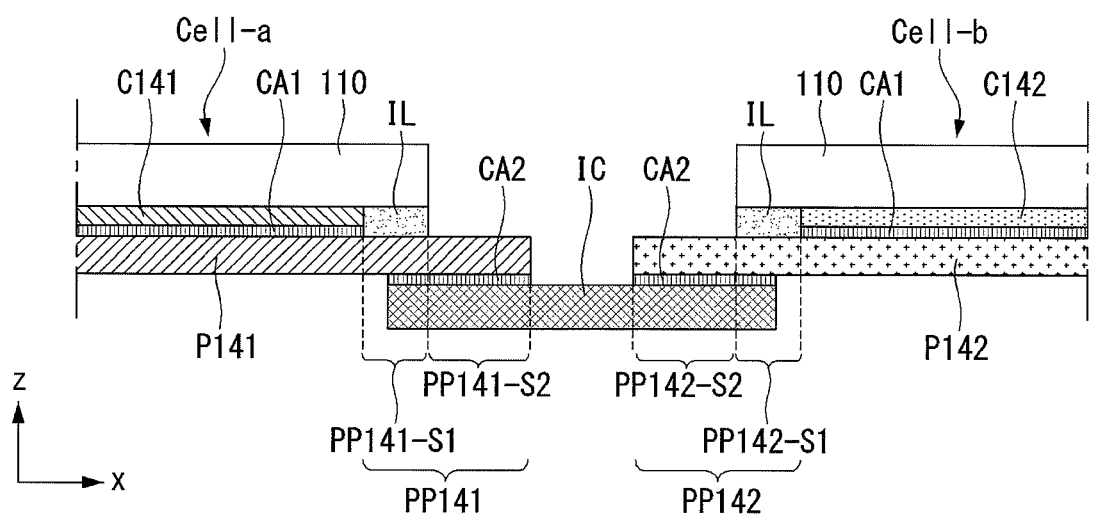

FIGS. 12 to 14 illustrate various structures, in which the solar cells of the solar cell module shown in FIG. 1 are connected through the interconnector.

More specifically, FIG. 12 illustrates a first embodiment of the structure of the cell string formed by connecting the solar cells through the interconnector, and FIG. 13 illustrates a second embodiment of the structure of the cell string.

A first solar cell Cell-a and a second solar cell Cell-b shown in FIG. 12 may use any one of the above-described solar cells according to the embodiment of the invention.

Accordingly, each of the first solar cell Cell-a and the second solar cell Cell-b shown in FIGS. 12 and 13 may include a semiconductor substrate 110, an emitter region 121, a back surface field region 172, and the like. Since those are described above, a further description may be briefly made or may be entirely omitted.

The first solar cell Cell-a and the second solar cell Cell-b applied to the solar cell module according to the embodiment of the invention each includes a first auxiliary electrode P141 and a second auxiliary electrode P142 and are connected to each other by connecting the interconnector IC to the first auxiliary electrode P141 and the second auxiliary electrode P142. Therefore, even if one solar cell is broken or damaged in the manufacturing process of the solar cell module, the embodiment of the invention may replace only the broken or damaged solar cell. Hence, the process yield may be further improved.

The interconnector IC and the first and second auxiliary electrodes P141 and P142 of the first and second solar cells Cell-a and Cell-b may contain different materials.

For example, all of the interconnector IC and the first and second auxiliary electrodes P141 and P142 may contain a conductive metal material, but may contain different materials.

For example, the first and second auxiliary electrodes P141 and P142 may contain only copper (Cu), and the interconnector IC may contain silver (Ag) or tin (Sn) as well as copper (Cu).

The first and second auxiliary electrodes P141 and P142 included in each of the first and second solar cells Cell-a and Cell-b respectively have a first auxiliary electrode pad PP141 and a second auxiliary electrode pad PP142, and the interconnector IC is connected to the first auxiliary electrode pad PP141 and the second auxiliary electrode pad PP142. Therefore, when the interconnector IC is connected to the first solar cell Cell-a and the second solar cell Cell-b, a thermal expansion stress applied to the semiconductor substrate 110 of each solar cell may be reduced.

For example, as shown in FIG. 12, the interconnector IC may be connected to a second area PP141-S2 of the first auxiliary electrode pad PP141 and a second area PP142-S2 of the second auxiliary electrode pad PP142, which are far from the semiconductor substrate 110, so as to further reduce the thermal expansion stress of the semiconductor substrate 110.

In this instance, the interconnector IC may be connected to the first and second auxiliary electrodes P141 and P142 of the first and second solar cells Cell-a and Cell-b through a conductive adhesive, for example, a second conductive adhesive CA2.

More specifically, the second conductive adhesive CA2 may be formed between the interconnector IC and the first auxiliary electrode pad PP141 and between the interconnector IC and the second auxiliary electrode pad PP142, so as to minimize a contact resistance between the interconnector IC and the first auxiliary electrode pad PP141 and a contact resistance between the interconnector IC and the second auxiliary electrode pad PP142 and further increase an adhesive strength therebetween.

The second conductive adhesive CA2 may be formed of the same material as the first conductive adhesive CA1. The interconnector IC may contain a conductive metal. For example, the interconnector IC may contain at least one of Cu, Au, Ag, and Al.

The second conductive adhesive CA2 may be formed using at least one of a solder paste, a conductive adhesive including conductive metal particles distributed in an adhesive resin of a paste type, and a conductive film of a film type including conductive metal particles distributed in an adhesive resin.

Alternatively, as shown in FIG. 13, the interconnector IC may physically contact and may be electrically connected to the first auxiliary electrode pad PP141 or the second auxiliary electrode pad PP142 through the heat and the pressure without the separate second conductive adhesive CA2.

In the solar cell module according to the embodiment of the invention, the interconnector IC may be different from the first and second auxiliary electrodes P141 and P142 of the first and second solar cells Cell-a and Cell-b in at least one of a width, a thickness, a layer structure, and a plane pattern.

For example, a thickness of the interconnector IC may be greater than a thickness of each of the first and second auxiliary electrodes P141 and P142. For example, the thickness of the interconnector IC may be equal to or greater than 1 mm, and the thickness of each of the first and second auxiliary electrodes P141 and P142 may be several tens to several hundreds of micrometers (μm).

Further, because the interconnector IC is connected to the first and second auxiliary electrodes P141 and P142 through the second conductive adhesive CA2, the interconnector IC may be formed at a layer level different from the second conductive adhesive CA2.

Further, a width of the interconnector IC in the first and second directions x and y may be different from a width of each of the first and second auxiliary electrodes P141 and P142 in the first and second directions x and y. A plane pattern of the interconnector IC may be different from a plane pattern of each of the first and second auxiliary electrodes P141 and P142.

In the solar cell module according to the embodiment of the invention, the interconnector IC may be spatially separated from the first and second auxiliary electrodes P141 and P142 of the first and second solar cells Cell-a and Cell-b. Namely, because the first auxiliary electrode P141 of the first solar cell Cell-a is electrically connected to the second auxiliary electrode P142 of the second solar cell Cell-b through the interconnector IC, the first auxiliary electrode pad PP141 included in the first solar cell Cell-a may be spatially separated from the second auxiliary electrode pad PP142 included in the second solar cell Cell-b.

Accordingly, as shown in FIGS. 12 and 13, the interconnector IC may be separated from the semiconductor substrate 110 of the first solar cell Cell-a or the semiconductor substrate 110 of the second solar cell Cell-b.

As described above, when the interconnector IC and the semiconductor substrate 110 are separated from each other, the thermal expansion stress of the semiconductor substrate 110 may be minimized. Further, an optical gain of the solar cell module may further increase through the interconnector IC. Hereinafter, the embodiment of the invention is described using the structure, in which the interconnector IC and the semiconductor substrate 110 are separated from each other, as an example.

As shown in FIGS. 12 and 13, when the interconnector IC and the semiconductor substrate 110 are separated from each other in the solar cell module according to the embodiment of the invention, the interconnector IC and the semiconductor substrate 110 of the first solar cell Cell-a may be separated from each other by a first distance GSI1, and the interconnector IC and the semiconductor substrate 110 of the second solar cell Cell-b may be separated from each other by a second distance GSI2. The first distance GSI1 may be equal to or different from the second distance GSI2.

As described above, in the solar cell module according to the embodiment of the invention, the interconnector IC is not directly connected to the semiconductor substrate 110 so as to connect the first solar cell Cell-a and the second solar cell Cell-b through the interconnector IC. Instead, the interconnector IC is connected to the first solar cell Cell-a and the second solar cell Cell-b through the first auxiliary electrode P141 and the second auxiliary electrode P142 formed on the back surface of the semiconductor substrate 110. Therefore, the heat does not need to be directly applied to the semiconductor substrate 110. Hence, the thermal expansion stress of the semiconductor substrate 110 may be minimized.

Further, because a distance between the first solar cell Cell-a and the second solar cell Cell-b may be freely set, a limit to the size of the solar cell module according to the embodiment of the invention may be free.

Further, the solar cell module according to the embodiment of the invention may reflect light incident between the semiconductor substrate 110 of the first solar cell Cell-a and the semiconductor substrate 110 of the second solar cell Cell-b and may allow the reflected light to be again incident on the semiconductor substrate 110 of the first solar cell Cell-a and the semiconductor substrate 110 of the second solar cell Cell-b through the front glass substrate FG, thereby further increasing the optical gain.

FIGS. 12 and 13 show that the interconnector IC is separated from the semiconductor substrate 110 of the first solar cell Cell-a or the semiconductor substrate 110 of the second solar cell Cell-b, as an example. On the contrary, as shown in FIG. 14, when the interconnector IC is connected to the back surface of the first auxiliary electrode pad PP141 and the back surface of the second auxiliary electrode pad PP142, the interconnector IC is not separated from the semiconductor substrate 110 and may overlap the semiconductor substrate 110 of the first solar cell Cell-a and the semiconductor substrate 110 of the second solar cell Cell-b.

For example, as shown in FIG. 14, the interconnector IC may be connected up to a first area PP141-S1 of the first auxiliary electrode pad PP141 and a first area PP142-S1 of the second auxiliary electrode pad PP142. In this instance, the interconnector IC may be connected to the back surface of the first auxiliary electrode pad PP141 and the back surface of the second auxiliary electrode pad PP142.

So far, the embodiment of the invention described that the front surface of the interconnector IC is flat. However, the front surface of the interconnector IC may have an uneven portion, so as to further increase the optical gain by further increasing a length of an optical path of reflected light through the interconnector IC. This is described in detail below.

Figure 15A:
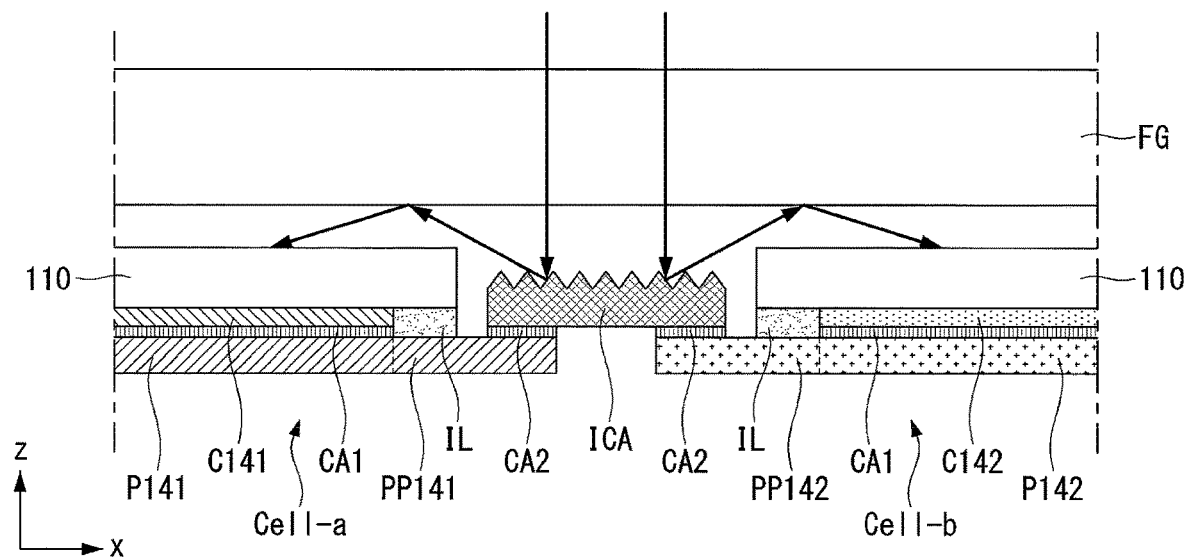
FIG. 15A illustrates a first embodiment of an interconnector for increasing an optical gain in the solar cell module shown in FIG. 1.

FIG. 15A illustrates a first embodiment of an interconnector for increasing the optical gain in the solar cell module shown in FIG. 1.

As shown in FIG. 15A, a front surface of an interconnector ICA according to the first embodiment of the invention may have uneven portions, and a thickness of the interconnector ICA may be non-uniform. Hence, light incident on a space between the first solar cell Cell-a and the second solar cell Cell-b through the front glass substrate FG of the solar cell module may be diffusely reflected by the uneven portions included in the front surface of the interconnector ICA and the front glass substrate FG and may be again incident on the semiconductor substrate 110 of the first solar cell Cell-a and the semiconductor substrate 110 of the second solar cell Cell-b.

As a result, the light incident on the space between the first solar cell Cell-a and the second solar cell Cell-b may be used to produce electric power, and photoelectric conversion efficiency of the solar cell module may be further improved.

Figure 15B:
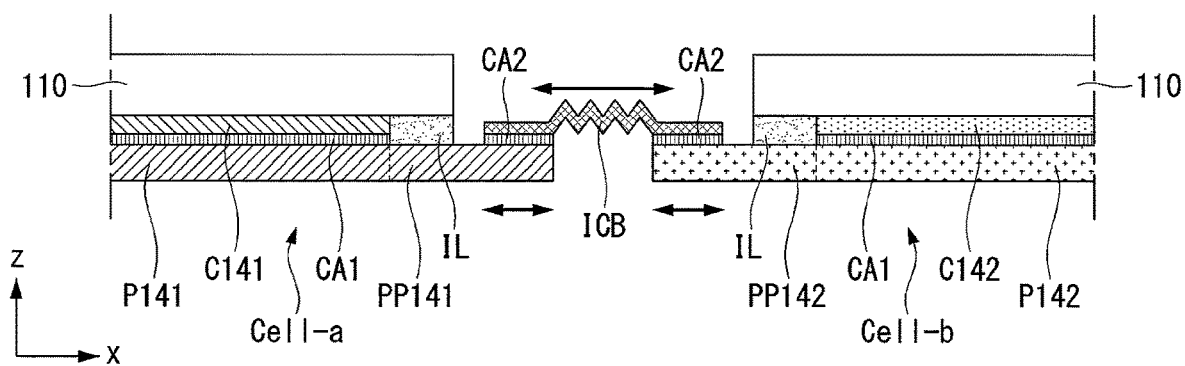
FIG. 15B illustrates a second embodiment of an interconnector corresponding to thermal expansion and thermal contraction of first and second auxiliary electrodes along with an increase in an optical gain in the solar cell module shown in FIG. 1.

FIG. 15B illustrates a second embodiment of an interconnector IC corresponding to thermal expansion and thermal contraction of the first and second auxiliary electrodes along with an increase in the optical gain in the solar cell module shown in FIG. 1.

As shown in FIG. 15B, a cross section of an interconnector ICB according to the second embodiment of the invention may have a zigzag shape. In this instance, a cross-sectional thickness of the interconnector ICB may be uniform.

The interconnector ICB according to the second embodiment of the invention may correspond to thermal expansion and thermal contraction of the first and second auxiliary electrodes P141 and P142 included in each of the first and second solar cells Cell-a and Cell-b as well as a reflection function described in FIG. 14.

More specifically, an internal temperature of the solar cell module may increase during an operation of the solar cell module, and the first and second auxiliary electrodes P141 and P142 included in each of the first and second solar cells Cell-a and Cell-b may thermally expand or contract in the first direction x.

Accordingly, a distance between the first auxiliary electrode P141 of the first solar cell Cell-a and the second auxiliary electrode P142 of the second solar cell Cell-b may decrease or increase. In this instance, as shown in FIG. 15B, a length of the interconnector ICB may decrease or increase in the first direction x depending on the thermal expansion and the thermal contraction of the first auxiliary electrode P141 of the first solar cell Cell-a and the second auxiliary electrode P142 of the second solar cell Cell-b. Hence, durability of the solar cell module may be further improved.

Figure 16:
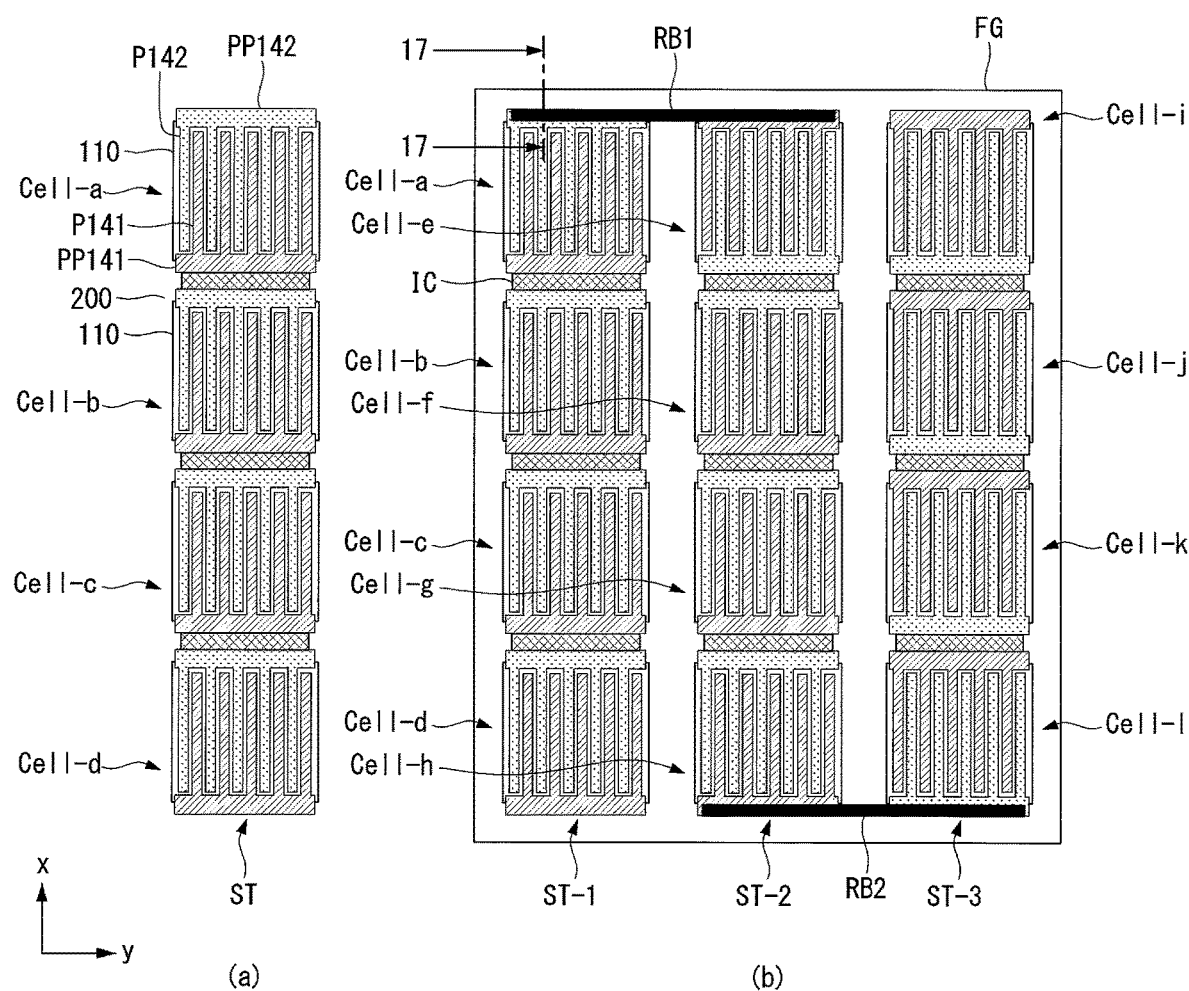
FIG. 16 illustrates an example of an entire plane structure of the solar cell module shown in FIG. 1.
Figure 17:
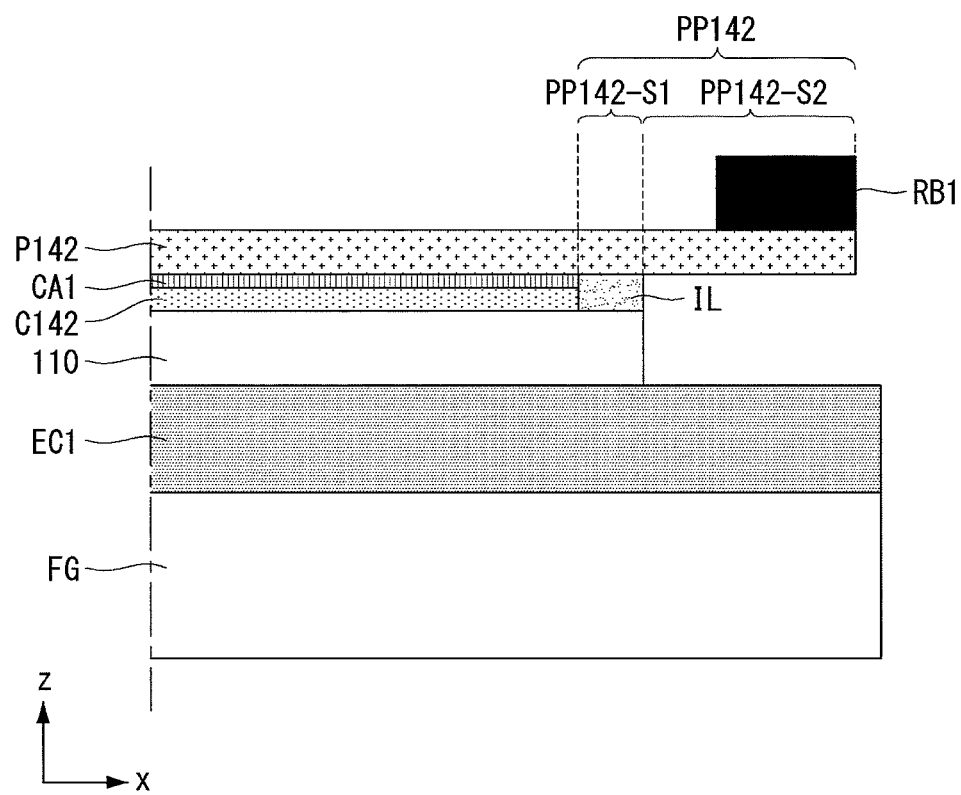
FIG. 17 is a cross-sectional view taken along line 17-17 of (b) of FIG. 16.

FIG. 16 illustrates an example of an entire plane structure of the solar cell module shown in FIG. 1, and FIG. 17 is a cross-sectional view taken along line 17-17 of (b) of FIG. 16.

More specifically, (a) of FIG. 16 shows a back surface of a cell string ST, and (b) of FIG. 16 shows that a plurality of cell strings ST-1 to ST-3 are disposed on a back surface of the front glass substrate FG.

As shown in (a) of FIG. 16, a plurality of solar cells Cell-a to Cell-d may be connected to one another by connecting an interconnector IC to a first auxiliary electrode P141 and a second auxiliary electrode P142 included in each solar cell. Hence, the plurality of solar cells Cell-a to Cell-d may be connected in the first direction x to form one cell string ST.

The first auxiliary electrode P141 and the second auxiliary electrode P142 are positioned on a back surface of a semiconductor substrate 110 of each of the solar cells Cell-a to Cell-d, and a separate structure is not positioned on back surfaces of the first auxiliary electrode P141 and the second auxiliary electrode P142. Therefore, as shown in (a) of FIG. 16, the first auxiliary electrode P141 and the second auxiliary electrode P142 may be naturally exposed to the outside of the cell string ST.

As shown in (B) of FIG. 16, the plurality of cell strings ST-1 to ST-3 configured as described above may be disposed on the back surface of the front glass substrate FG.

More specifically, when a front surface of each semiconductor substrate 110 included in the cell strings ST-1 to ST-3 is disposed toward the front glass substrate FG, the first auxiliary electrode P141 and the second auxiliary electrode P142 formed on the back surface of the semiconductor substrate 110 may be exposed.

Conductive ribbons RB1 and RB2 for connecting the cell strings ST-1 to ST-3 in series may be naturally connected to the back surfaces of the first and second auxiliary electrodes P141 and P142.

For example, as shown in (B) of FIG. 16, the first conductive ribbon RB1 may connect the first cell string ST-1 and the second cell string ST-2, which extend in the first direction x, in series in the second direction y. Further, the second conductive ribbon RB2 may connect the second cell string ST-2 and the third cell string ST-3, which extend in the first direction x, in series in the second direction y.

In this instance, the first conductive ribbon RB1 may connect a first auxiliary electrode pad PP141 included in a last solar cell Cell-a of the first cell string ST-1 to a second auxiliary electrode pad PP142 included in a last solar cell Cell-e at one end of the second cell string ST-2. The second conductive ribbon RB2 may connect a first auxiliary electrode pad PP141 included in a last solar cell Cell-h at other end of the second cell string ST-2 to a second auxiliary electrode pad PP142 included in a last solar cell Cell-1 of the third cell string ST-3.

Accordingly, for example, as shown in FIG. 17 which is a cross-sectional view taken along line 17-17 of the last solar cell Cell-a of the first cell string ST-1 shown in FIG. 16, the first conductive ribbon RB1 may be connected to a back surface of the second auxiliary electrode pad PP142. FIG. 17 shows that the first conductive ribbon RB1 is connected to a second area PP142-S2 of the second auxiliary electrode pad PP142, as an example. However, the embodiment of the invention is not limited thereto. For example, the first conductive ribbon RB1 may overlap and may be connected to a first area PP142-S1 of the second auxiliary electrode pad PP142.

So far, the embodiment of the invention described the components of the solar cell module. Hereinafter, a method for manufacturing the solar cell module according to the embodiment of the invention is described.

FIGS. 18A to 18I illustrate a method for manufacturing the solar cell module according to the embodiment of the invention.

The method for manufacturing the solar cell module according to the embodiment of the invention may include a cell forming operation, a cell string forming operation, an operation for disposing the cell string on the front glass substrate FG, and a an operation for disposing the back sheet on the cell string and then capsulating the solar cell module through the lamination process.

As shown in FIGS. 18A to 18E, in the cell forming operation, the first auxiliary electrode P141 and the second auxiliary electrode P142 may be formed in parallel with each other on the back surface of the semiconductor substrate 110, on which the plurality of first electrodes C141 and the plurality of second electrodes C142 positioned in parallel with each other are formed.

In this instance, the emitter region 121, the back surface field region 172, the anti-reflection layer 130, the plurality of first electrodes C141, and the plurality of second electrodes C142 may be formed on the semiconductor substrate 110 through the semiconductor manufacturing process.

The plurality of first electrodes C141 may be connected to the emitter region 121, and the plurality of second electrodes C142 may be connected to the back surface field region 172.

Figure 18A:
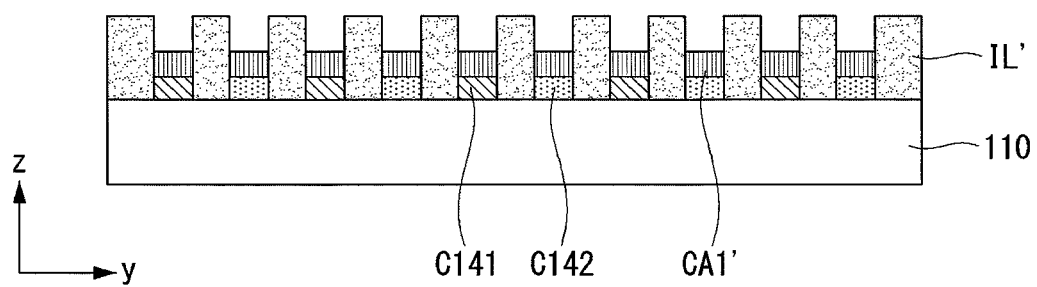
FIGS. 18A to 18I illustrate a method for manufacturing a solar cell module according to an example embodiment of the invention.

The emitter region 121, the back surface field region 172, and the anti-reflection layer 130 formed on the semiconductor substrate 110 are not shown in FIG. 18A. However, as described above with reference to FIGS. 2 and 3, the emitter region 121, the back surface field region 172, and the anti-reflection layer 130 may be formed on the semiconductor substrate 110.

First, as shown in FIG. 18A, an insulating material IL' for forming the insulating layer IL and a first conductive connection material CA1' for forming the first conductive adhesive CA1 may be formed on the back surface of the semiconductor substrate 110, on which the first electrodes C141 and the second electrodes C142 are formed, so as to form the first auxiliary electrode P141 and the second auxiliary electrode P142 on the back surface of the semiconductor substrate 110, on which the first electrodes C141 and the second electrodes C142 are formed.

More specifically, the first conductive connection material CA1' may be formed on each of the back surfaces of the first and second electrodes C141 and C142, and the insulating material IL' may be formed in a space between the first and second electrodes C141 and C142. Thus, the first conductive connection materials CA1' may be arranged to be separated from each other on the back surfaces of the first and second electrodes C141 and C142 at regular intervals. Alternatively, the first conductive connection material CA1' may be successively arranged.

The first conductive connection material CA1' may have a ball shape or a stud shape and may contain at least one of Sn, Cu, Ag, and Bi. For example, the first conductive connection material CA1' may be formed of a solder ball.

A size of the first conductive connection material CA1' may be equal to or less than a width of the first electrode C141 or a width of the second electrode C142. For example, the size of the first conductive connection material CA1' may be about 5% to 95% of the width of the first electrode C141 or the width of the second electrode C142. More specifically, the size of the first conductive connection material CA1' may be about 5 μm to 100 μm. A melting point of the first conductive connection material CA1' may be about 130° C. to 250° C.

Further, the insulating material IL' formed between the first and second electrodes C141 and C142 may be an epoxy resin. A melting point of the insulating material IL' may be equal to or lower than the melting point of the first conductive connection material CA1'.

Figure 18B:
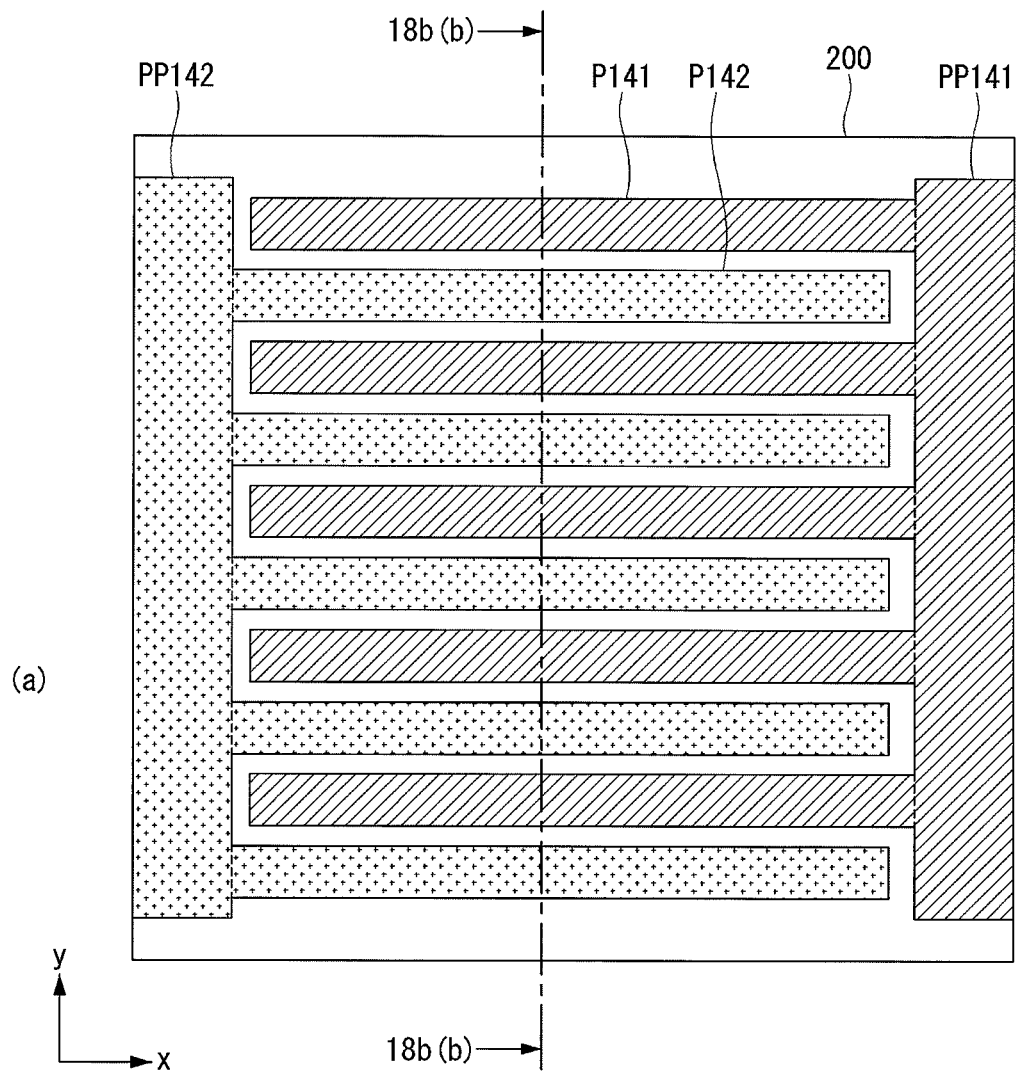
Figure 18B:
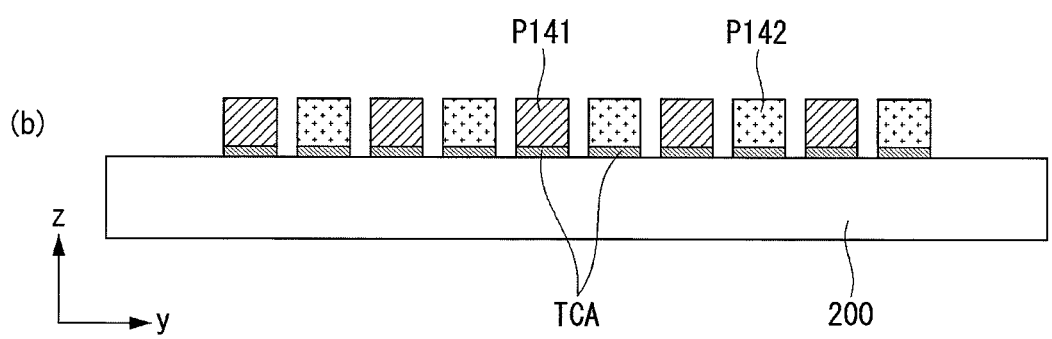

Next, as shown in FIG. 18B, after the insulating material IL' and the first conductive connection material CA1' are formed on the back surface of the semiconductor substrate 110, on which the first electrodes C141 and the second electrodes C142 are formed, an insulating member 200, on which the first auxiliary electrode P141 and the second auxiliary electrode P142 are formed on one surface, may be attached to the back surface of the semiconductor substrate 110. Further, the insulating member 200 may be separated from the first auxiliary electrode P141 and the second auxiliary electrode P142.

More specifically, as shown in (a) and (b) of FIG. 18B, the first auxiliary electrode P141 and the second auxiliary electrode P142 may be temporarily attached to the insulating member 200 using a crosslinking agent TCA. A pattern of the first and second auxiliary electrodes P141 and P142 may use the pattern shown in FIG. 4 as an example. Alternatively, the pattern of the first and second auxiliary electrodes P141 and P142 may use one of the patterns shown in FIGS. 6, 8, and 10.

The crosslinking agent TCA may have an adhesive function at room temperature (for example, about 25° C.) and may lose the adhesive function at a temperature equal to or higher than room temperature. For example, when the crosslinking agent TCA contains a thermoplastic resin having an adhesive function, the crosslinking agent TCA may lose the adhesive function at a temperature equal to or higher than a predetermined temperature.

The crosslinking agent TCA may include at least one of a silicon-based adhesive, a thermoplastic resin adhesive, a thermoplastic epoxy resin adhesive, an acrylic resin adhesive, and a wax type resin adhesive.

A softening temperature or a melting temperature of the crosslinking agent TCA may be lower than a melting point of the insulating member 200 and may be about 80° C. to 130° C., for example.

However, the crosslinking agent TCA is not limited to the above-described characteristics. The crosslinking agent TCA may use any material as long as it has the adhesive function at room temperature and loses the adhesive function at a temperature higher or lower than room temperature. For example, the crosslinking agent TCA may include thermosetting beads, which have an increasing volume as a temperature increases, or a blowing agent which has an increasing volume as a temperature decreases. Hereinafter, the embodiment of the invention is described using the crosslinking agent TCA including the thermoplastic resin, as an example, for the sake of brevity and ease of reading.

A material of the insulating member 200 is not particularly limited as long as it is an insulating material. It may be preferable, but not required, that the melting point of the insulating member 200 is higher than a melting point of the first conductive adhesive CA1. For example, the melting point of the insulating member 200 may be equal to or higher than about 300° C. More specifically, the insulating member 200 may be formed of at least one of polyimide, epoxy-glass, polyester, and bismaleimide triazine (BT) resin, each of which has a thermal resistance to a high temperature.

The insulating member 200 may be formed in the form of a flexible film or in the form of a hard plate which is not flexible.

Figure 18C:
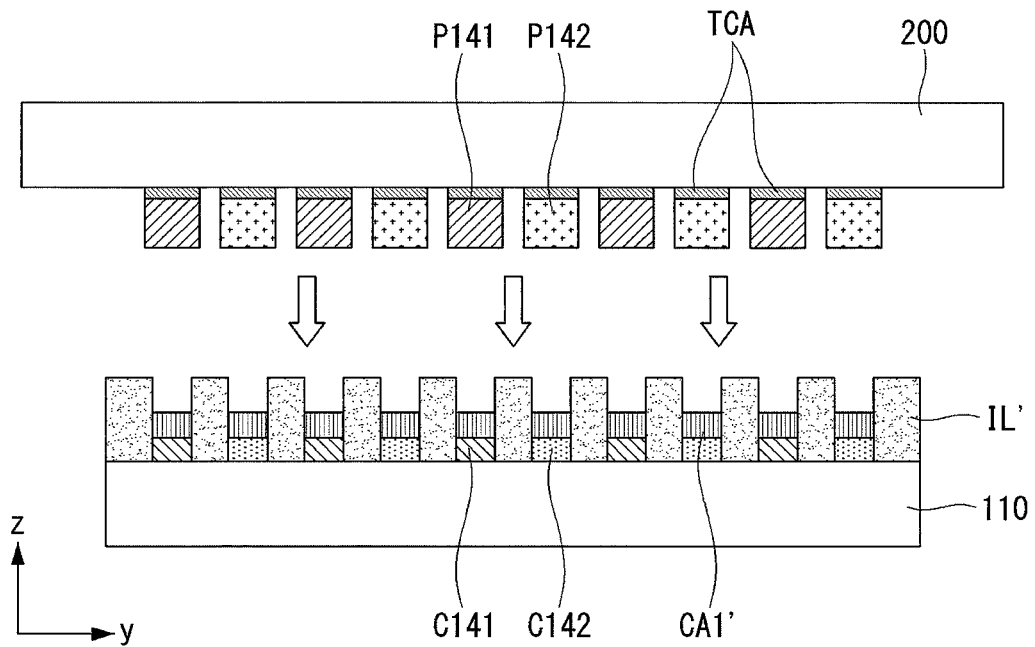

Next, as shown in FIG. 18C, the insulating member 200, on which the first auxiliary electrode P141 and the second auxiliary electrode P142 are formed on one surface using the crosslinking agent TCA, may be aligned on the back surface of the semiconductor substrate 110 in an arrow direction and may be attached to the back surface of the semiconductor substrate 110.

More specifically, as shown in FIG. 18C, the alignment process may be performed to overlap the first electrode C141 and the first auxiliary electrode P141 and to overlap the second electrode C142 and the second auxiliary electrode P142 on the back surface of the semiconductor substrate 110, on which the insulating material IL' and the first conductive connection material CA1' are formed. Then, an attaching operation may be performed to attach a front surface of the insulating member 200 to the back surface of the semiconductor substrate 110.

A pressurization process for applying a proper pressure to the insulating member 200 may be performed together while performing a thermal process of about 130° C. to 250° C. on the insulating member 200 in the attaching operation.

The thermal process may be performed by continuously applying air of a high temperature to the first conductive connection material CA1', or may be performed in a state where the semiconductor substrate 110 is positioned on a plate, to which the above temperature is applied.

Figure 18D:
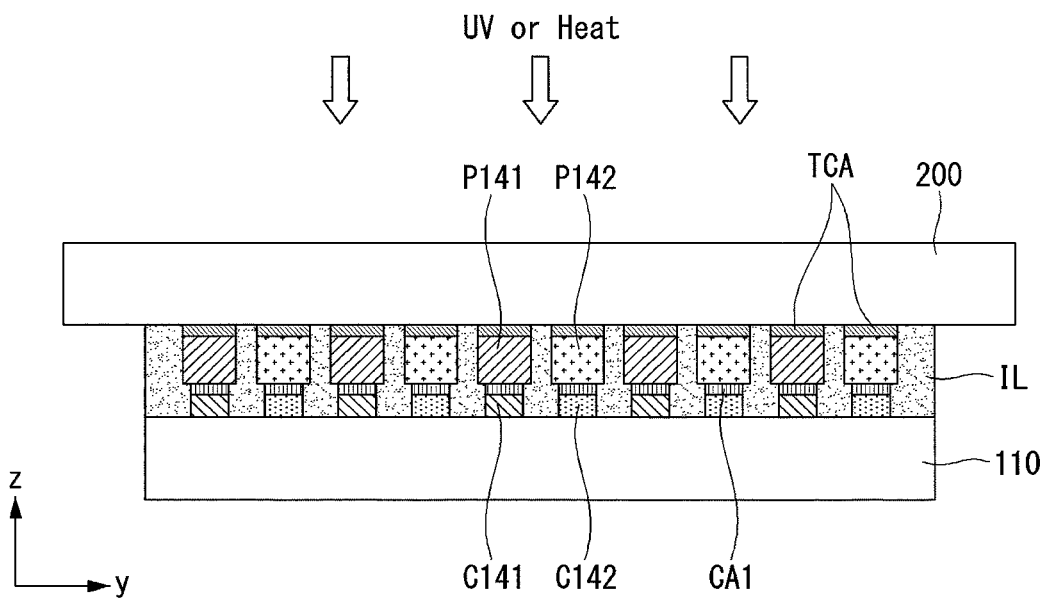

Hence, as shown in FIG. 18D, the first conductive connection material CA1' may be spread between the first electrode C141 and the first auxiliary electrode P141 through the attaching operation performed at a temperature of about 130° C. to 250° C. and thus may connect the first electrode C141 and the first auxiliary electrode P141. Further, the second electrode C142 and the second auxiliary electrode P142 may be connected in the same manner as the first electrode C141 and the first auxiliary electrode P141.

The insulating material IL' may be filled in the space between the first and second electrodes C141 and C142 and the space between the first and second auxiliary electrodes P141 and P142 through the attaching operation to form the insulating layer IL.

The method may minimize the thermal expansions stress of the semiconductor substrate 110 when the first and second auxiliary electrodes P141 and P142 are formed on the back surface of the semiconductor substrate 110. Hence, a fracture or a crack may be prevented from being generated in the semiconductor substrate 110, and at the same time, the resistances of the electrodes formed on the back surface of the semiconductor substrate 110 may be greatly reduced.

The manufacturing method according to the embodiment of the invention may relatively reduce time required in the semiconductor manufacturing process by relatively reducing the thicknesses of the first and second electrodes C141 and C142 formed on the semiconductor substrate 110.

The connection between the first electrodes C141 and the first auxiliary electrode P141 and the connection between the second electrodes C142 and the second auxiliary electrode P142 may be performed through one thermal process, and thus the manufacturing time of the solar cell may be further reduced.

After the first auxiliary electrode P141 is attached and connected to the plurality of first electrodes C141 through the first conductive adhesive CA1 and the second auxiliary electrode P142 is attached and connected to the plurality of second electrodes C142 through the first conductive adhesive CA1 in the attaching operation, a peeling operation for separating the insulating member 200 from the first and second auxiliary electrodes P141 and P142 may be performed.

A temperature of the peeling operation may be lower than a temperature of the attaching operation and may be about 80° C. to 130° C., for example.

Hence, after the first and second electrodes C141 and C142 are respectively attached and connected to the first and second auxiliary electrodes P141 and P142 in the attaching operation, the peeling operation may be performed when the process temperature reaches about 80° C. to 130° C. while reducing the process temperature.

Alternatively, as shown in FIG. 18D, after the process temperature is completely reduced to room temperature, the peeling operation may be performed through a separate process for applying ultraviolet (UV) ray or heat to the other surface of the insulating member 200, on which the first and second auxiliary electrodes P141 and P142 are not formed.

As described above, when the peeling operation is performed through the separate process, the peeling operation may be performed through the UV processing or the thermal processing subsequent to the attaching operation after the temperature reduction in the attaching operation is completed, or may be performed after the cell string forming operation for connecting the plurality of solar cells through the interconnector IC is completed.

In other words, the peeling operation may be performed (1) during the reduction of the process temperature in the attaching operation, or (2) through the UV processing or the thermal processing subsequent to the attaching operation after the temperature reduction in the attaching operation is completed, or (3) in a state where the cell string forming operation is completed after the attaching operation. The order of the peeling operation may be freely changed depending on the characteristics of the crosslinking agent TCA.

The method for manufacturing the solar cell module according to the embodiment of the invention illustrated in FIGS. 18A to 18I uses the peeling operation (2) as an example.

Figure 18E:
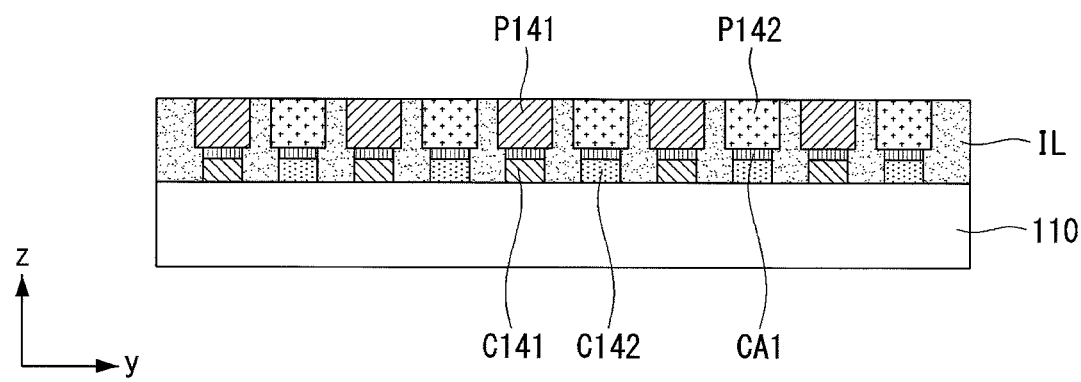

As described above, when the peeling operation is performed through the UV processing or the thermal processing, an adhesive strength of the crosslinking agent TCA is reduced. As shown in FIG. 18E, the insulating member 200 may be separated from the first auxiliary electrode P141 and the second auxiliary electrode P142.

Figure 18F:
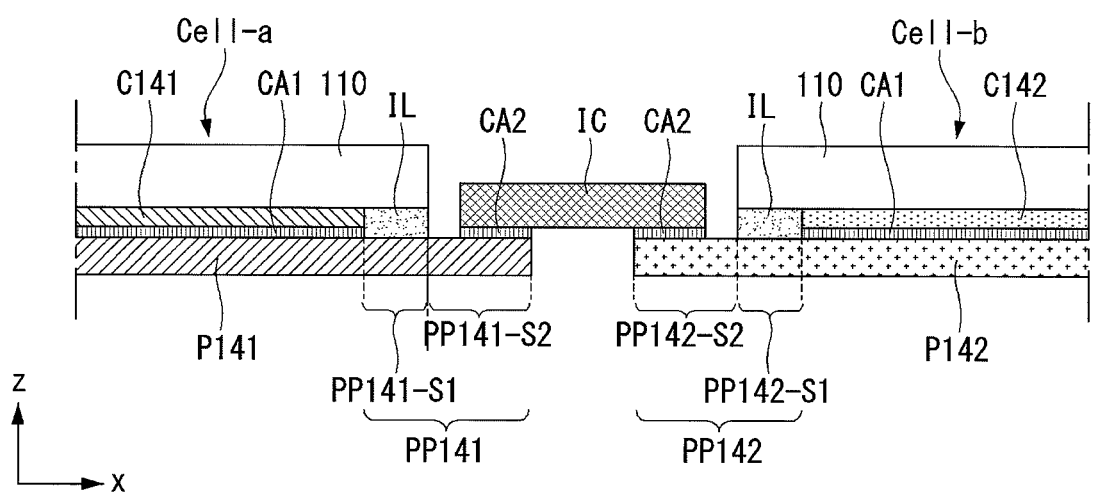

Next, as shown in FIG. 18F, the cell string forming operation for connecting the plurality of solar cells may be performed. More specifically, in the cell string forming operation, the first auxiliary electrode P141 of the first solar cell Cell-a and the second auxiliary electrode P142 of the second solar cell Cell-b may be electrically connected through the interconnector IC.

For example, as shown in FIG. 18F, when the interconnector IC is attached to the front surface of the first auxiliary electrode P141 and the front surface of the second auxiliary electrode P142, the second conductive adhesive CA2 may be applied to a front surface of the second area PP141-S2 of the first auxiliary electrode pad PP141 and a front surface of the second area PP142-S2 of the second auxiliary electrode pad PP142 exposed to the outside of the semiconductor substrate 110 of each of the plurality of solar cells. Hence, one side of the interconnector IC may be attached to the second area PP141-S2 of the first auxiliary electrode pad PP141 included in the first solar cell Cell-a, and the other side of the interconnector IC may be attached to the second area PP142-S2 of the second auxiliary electrode pad PP142 included in the second solar cell Cell-b.

FIG. 18F shows that the interconnector IC is attached to the front surface of the second area PP141-S2 of the first auxiliary electrode pad PP141 and the front surface of the second area PP142-S2 of the second auxiliary electrode pad PP142 so as to improve the optical gain of the solar cell module, as an example. On the contrary, as shown in FIG. 14, the interconnector IC may be attached to the back surface of the first auxiliary electrode pad PP141 and the back surface of the second auxiliary electrode pad PP142.

The material of the second conductive adhesive CA2 may be the same as or different from the material of the first conductive adhesive CA1.

Figure 18G:
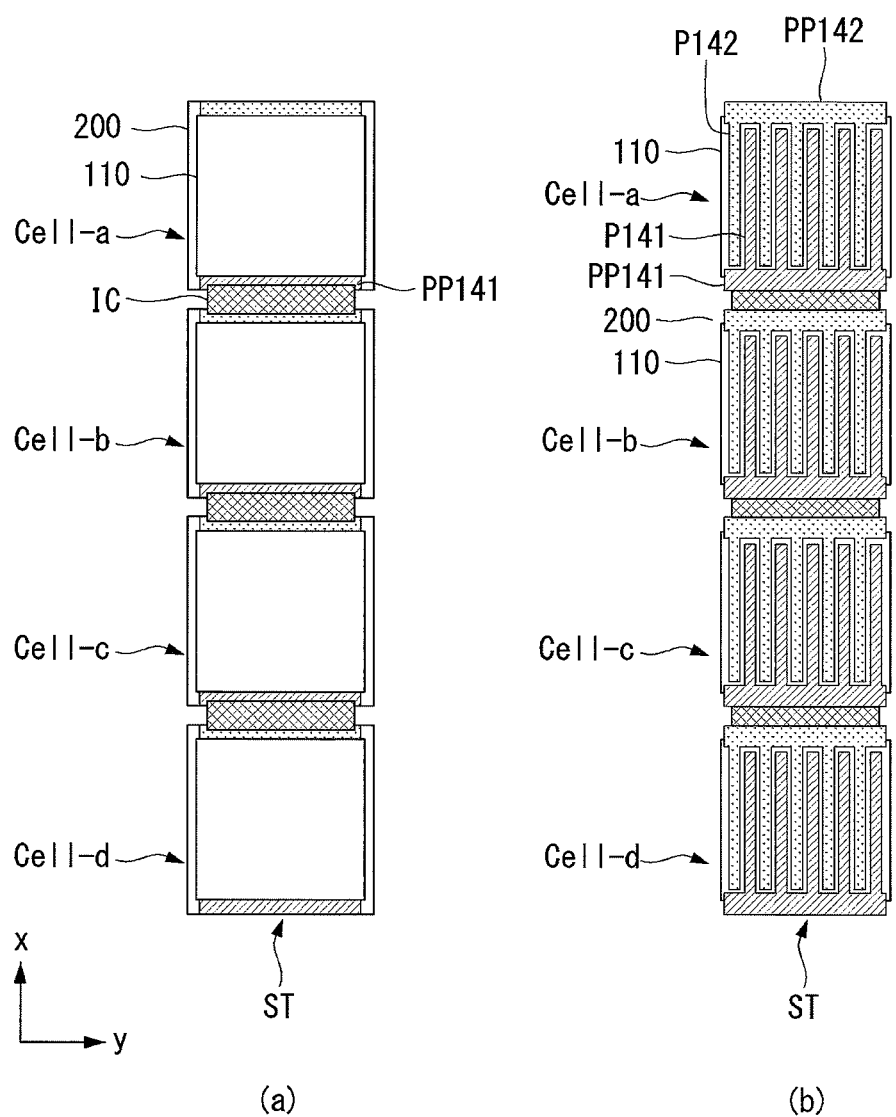

As described above, the plurality of solar cells may be connected through the interconnector IC to form the cell string ST as shown in FIG. 18G.

In FIG. 18G, (a) shows the cell string ST when viewed from the front surface, and (b) shows the cell string ST when viewed from the back surface.

In the method for manufacturing the solar cell module according to the embodiment of the invention, the back surface of the first auxiliary electrode P141 and the back surface of the second auxiliary electrode P142 may be naturally exposed when viewed from the back surface of the cell string ST. Hence, the plurality of cell strings ST formed in the first direction x may be more easily connected to one another through a ribbon in the second direction y.

Figure 18H:
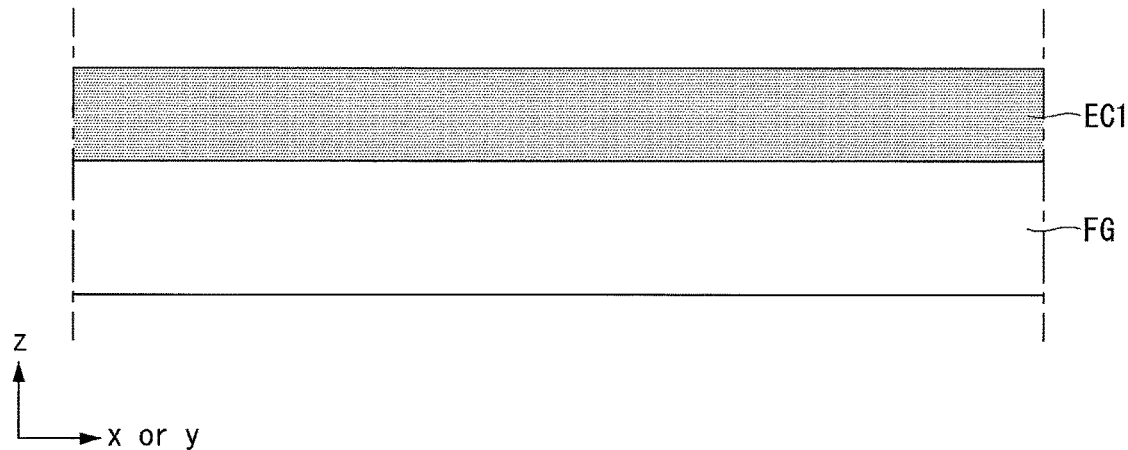

After the cell strings ST are formed as shown in FIG. 18G, the upper encapsulant EC1 may be applied and formed on the front glass substrate FG as shown in FIG. 18H. Then, as shown in FIG. 18I, the plurality of cell strings ST may be disposed so that the front surfaces of the semiconductor substrates 110 are disposed toward the front glass substrate FG, to which the upper encapsulant EC1 is applied.

Hence, as described above with reference to FIG. 16, the plurality of cell strings ST may be disposed on the front glass substrate FG, and the back surfaces of the first and second auxiliary electrodes P141 and P142 of the cell strings ST may be naturally exposed. As a result, the plurality of cell strings ST may be more easily connected to one another through the ribbons RB1 and RB2.

Figure 18I:
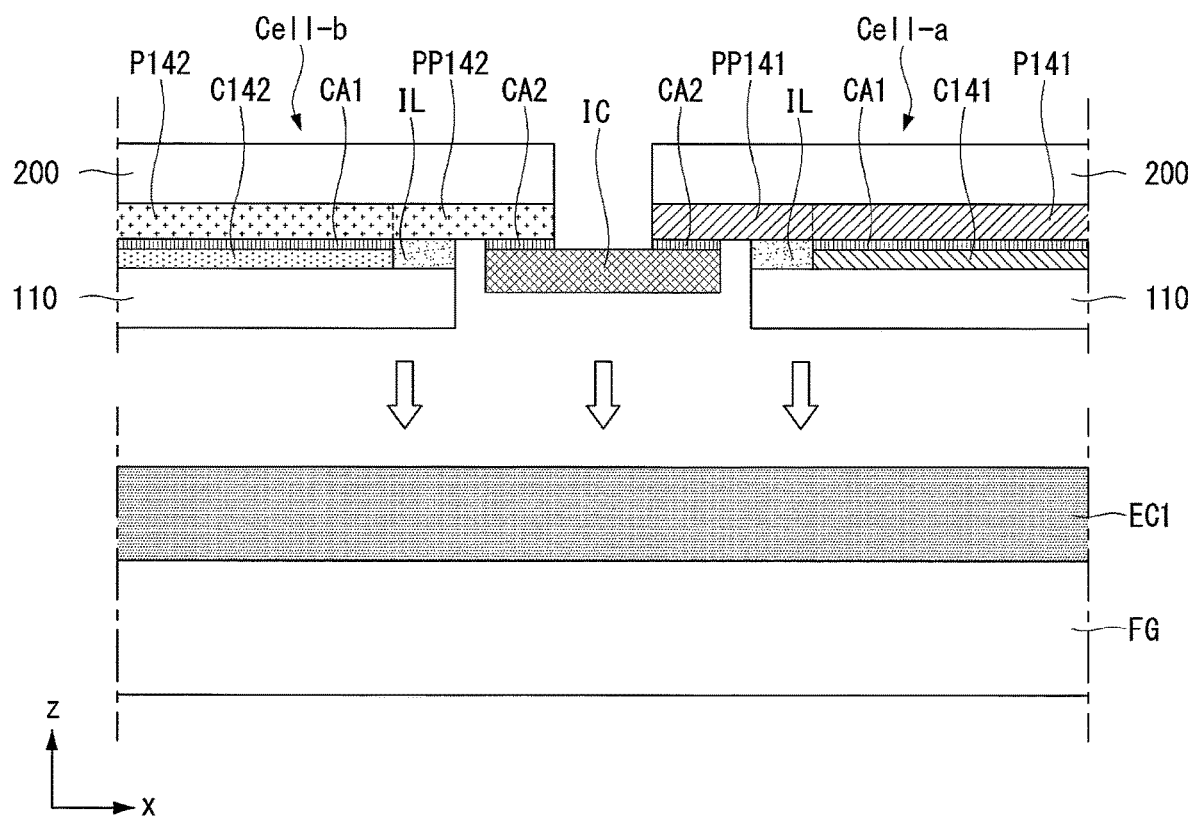

After the plurality of cell strings ST are disposed on the front glass substrate FG and are connected through the ribbons RB1 and RB2 as shown in FIG. 18I, the lamination process may be performed in a state where the lower encapsulant EC2 is applied and formed on the cell strings ST and the back sheet BS is disposed on the lower encapsulant EC2. Hence, the solar cell module shown in FIG. 1 may be completed.

In the method for manufacturing the solar cell module according to the embodiment of the invention, even if the thickness of the electrodes formed on the back surface of the semiconductor substrate 110 increase due to the first and second auxiliary electrodes P141 and P142, a bowing phenomenon of the semiconductor substrate 110 may be minimized and the thermal expansion stress of the semiconductor substrate 110 may be minimized. Further, the efficiency of the solar cell module may be further improved through an increase in the optical gain of the solar cell module, and time and yield of the manufacturing process of the solar cell module may be further improved.

In the method for manufacturing the solar cell module according to the embodiment of the invention, the first conductive adhesive CA1 is formed of the solder ball in the attaching operation included in the cell forming operation, as an example. However, on the contrary, the first conductive adhesive CA1 may be formed in other forms instead of the solder ball in the attaching operation.

FIGS. 19A to 19D illustrate another example of the attaching operation in the method for manufacturing the solar cell module according to the embodiment of the invention.

Figure 19A:
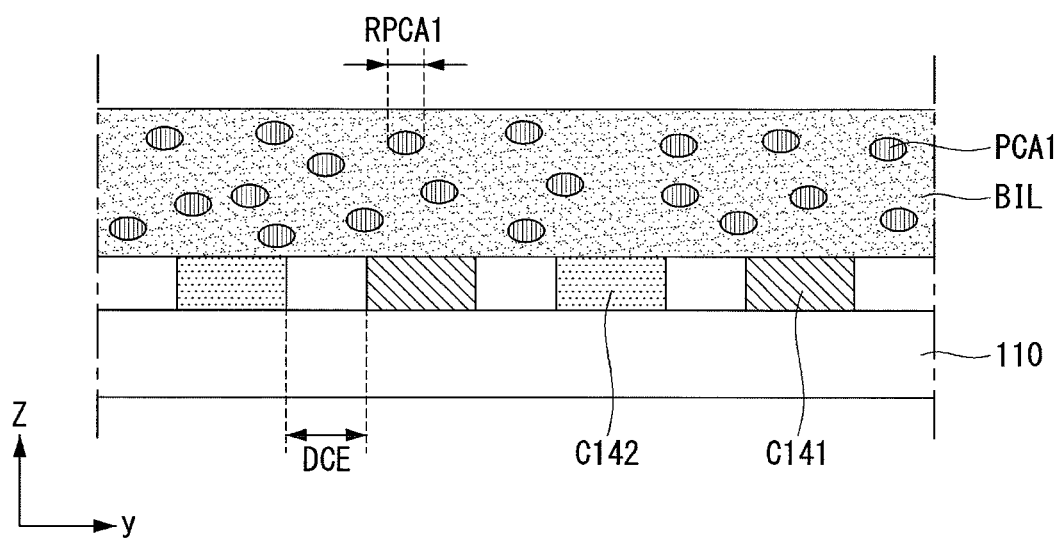
FIGS. 19A to 19D illustrate another example of an attaching operation in a method for manufacturing a solar cell module according to an example embodiment of the invention.

Unlike the above-described method, as shown in FIG. 19A, a conductive adhesive film PCA1+BIL may be used to attach the insulating member 200, on which the first and second auxiliary electrodes P141 and P142 are formed, to the back surface of the semiconductor substrate 110, on which the plurality of first and second electrodes C141 and C142 are formed, instead of the first conductive adhesive CA1 of the solder ball type.

More specifically, the conductive adhesive film PCA1+BIL may be obtained by distributing a plurality of conductive metal particles PCA1 in a base BIL of an insulating material. The size (for example, a diameter RPCA1) of the conductive metal particle PCA1 may be less than a distance DCE between the first electrode C141 and the second electrode C142 and/or a distance between the first auxiliary electrode P141 and the second auxiliary electrode P142.

For example, the diameter RPCA1 of the conductive metal particle PCA1 may be about 5% to 50% of the distance DCE between the first electrode C141 and the second electrode C142 and/or the distance between the first auxiliary electrode P141 and the second auxiliary electrode P142. However, the embodiment of the invention is not limited thereto.

As shown in FIG. 19A, the conductive adhesive film PCA1+BIL may be formed on the first electrode C141 and the second electrode C142 formed on the back surface of the semiconductor substrate 110.

Figure 19B:
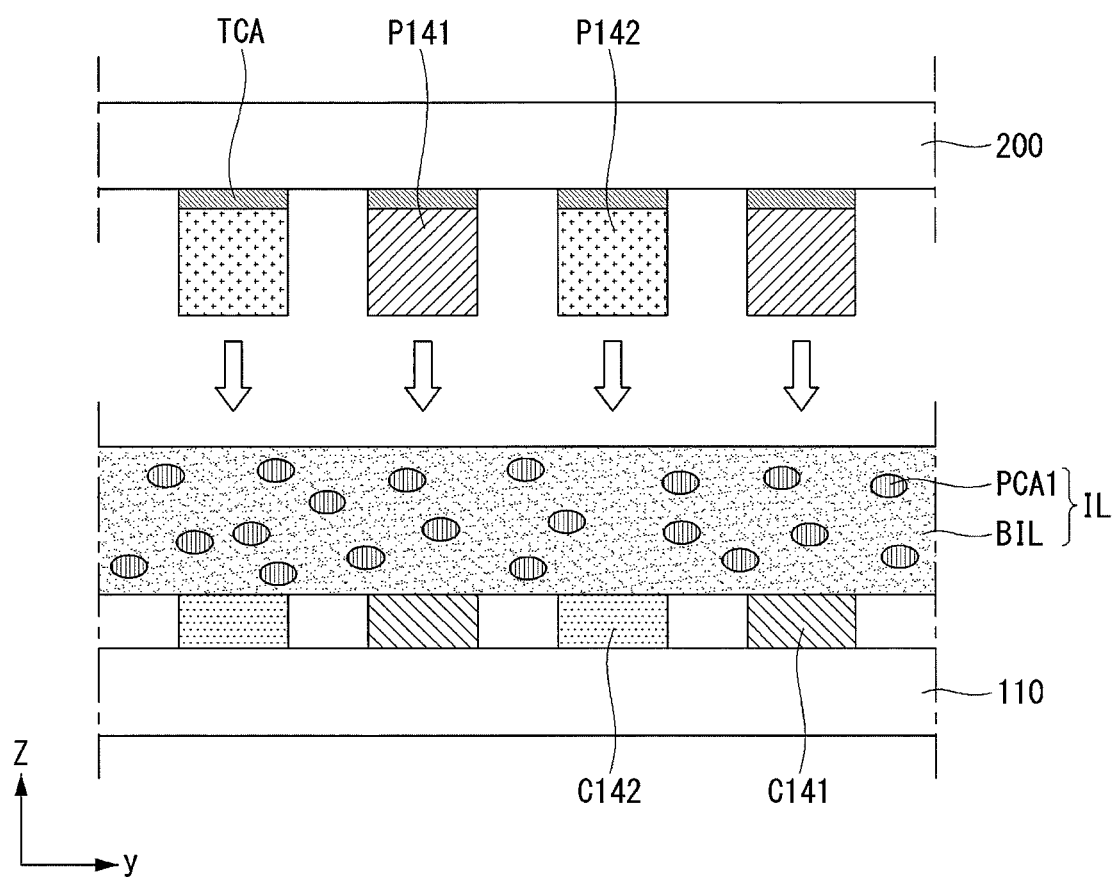

Next, as shown in FIG. 19B, an alignment process may be performed, so that the first auxiliary electrode P141 and the second auxiliary electrode P142 formed on the front surface of the insulating member 200 respectively overlap the first electrode C141 and the second electrode C142. Then, the insulating member 200 may be attached to the back surface of the semiconductor substrate 110 through the proper pressure and heat. In this instance, a temperature of heat may be about 130° C. to 250° C. or may be less than about 130° C.

As described above, the first auxiliary electrode P141 and the second auxiliary electrode P142 may be temporarily attached to the insulating member 200 using the crosslinking agent TCA. Since this is described above, a further description may be briefly made or may be entirely omitted.

Figure 19C:
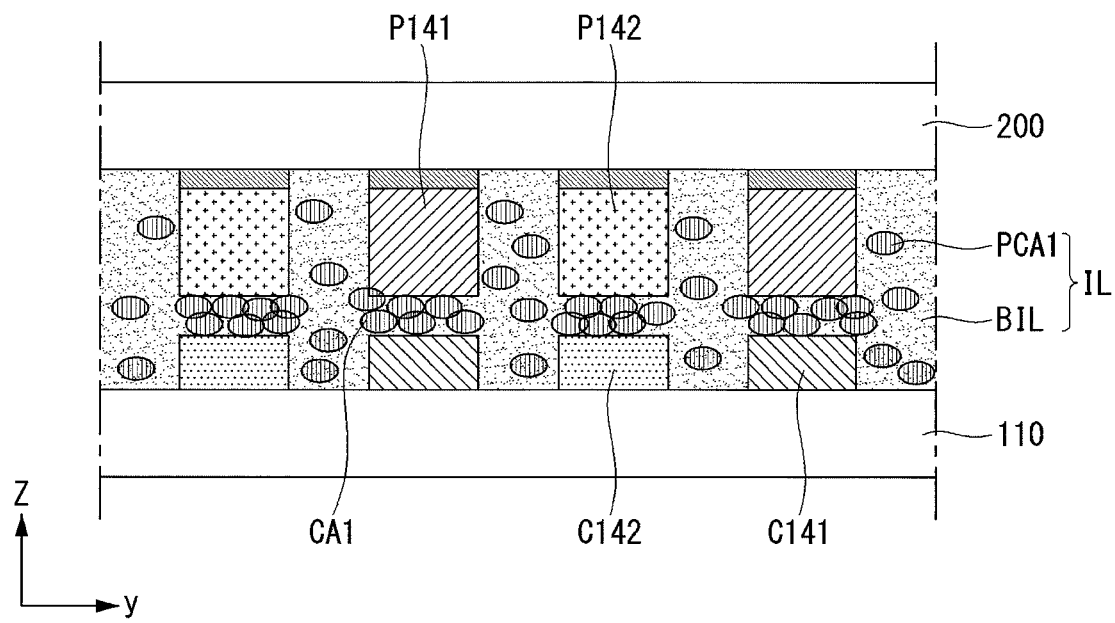

As shown in FIG. 19C, the conductive metal particles PCA1 may be adhered to one another in an overlap portion between the first electrode C141 and the first auxiliary electrode P141 and an overlap portion between the second electrode C142 and the second auxiliary electrode P142, thereby forming a first conductive adhesive CA1. The conductive metal particles PCA1 may be separated from one another in the base BIL of the insulating material in a non-overlap portion, thereby forming an insulating layer IL.

Hence, the connection between the first electrode C141 and the first auxiliary electrode P141 and the connection between the second electrode C142 and the second auxiliary electrode P142 may be performed through the first conductive adhesive CA1 formed by adhering the plurality of conductive metal particles PCA1. The insulation between the first electrode C141 and the second electrode C142 and the insulation between the first auxiliary electrode P141 and the second auxiliary electrode P142 may be performed through the insulating layer IL formed by separating the conductive metal particles PCA1 from one another in the base BIL of the insulating material.

Figure 19D:
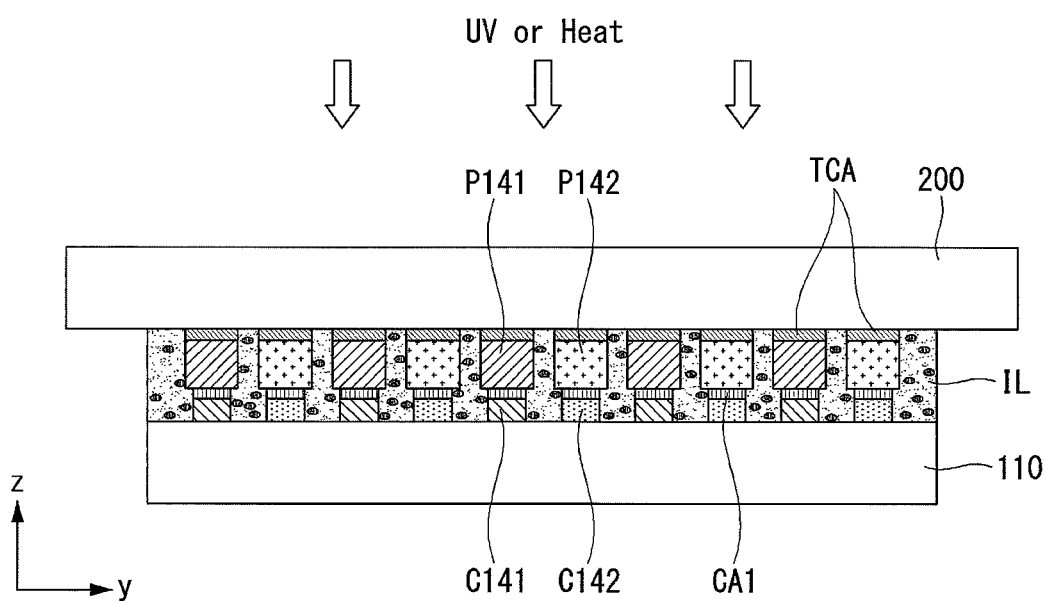

As shown in FIG. 19D, after the first electrode C141 and the second electrode C142 are respectively attached to the first auxiliary electrode P141 and the second auxiliary electrode P142 through the conductive adhesive film PCA1+ BIL, ultraviolet (UV) ray or heat may be applied to separate the insulating member 200 from the first auxiliary electrode P141 and the second auxiliary electrode P142 through one of the above-described peeling operations (1) to (3).

Further, the insulating member 200 may be removed by irradiating plasma, or may be removed using a grinder.

So far, the embodiment of the invention described the method for attaching the insulating member 200, on which the first auxiliary electrode P141 and the second auxiliary electrode P142 are formed, to the back surface of the semiconductor substrate 110 to form the first auxiliary electrode P141 and the second auxiliary electrode P142 on the back surface of the semiconductor substrate 110 in the method for manufacturing the solar cell module according to the embodiment of the invention. However, the first auxiliary electrode P141 and the second auxiliary electrode P142 may be formed through other methods.

FIGS. 20A to 20F illustrate another example of the cell forming operation in the method for manufacturing the solar cell module according to the embodiment of the invention.

The method for manufacturing the solar cell module according to the embodiment of the invention may use a cell forming operation including an insulating layer forming operation, an open operation, a metal layer forming operation, and an auxiliary electrode forming operation.

Figure 20A:
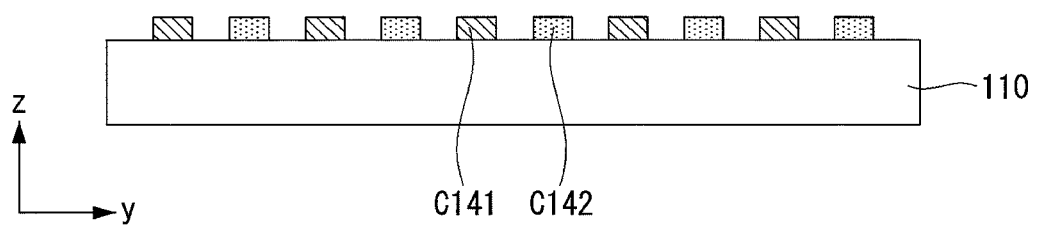
FIGS. 20A to 20F illustrate another example of a method for forming a cell in a method for manufacturing a solar cell module according to an example embodiment of the invention.
Figure 20B:
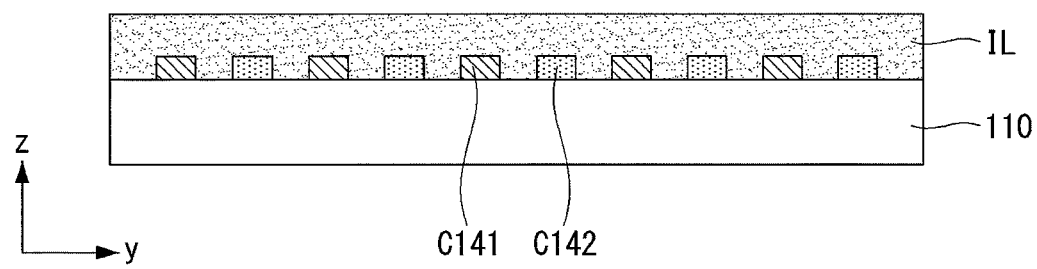

First, as shown in FIG. 20A, the back surface of the semiconductor substrate 110, on which the plurality of first and second electrodes C141 and C142 are formed, may be positioned upward. As shown in FIG. 20B, the insulating layer IL may be formed on the entire back surface of the semiconductor substrate 110 to cover the plurality of first and second electrodes C141 and C142.

In the embodiment disclosed herein, the insulating layer IL may be a film or a paste formed of thermoplastic polymer. For example, the insulating layer IL may contain at least one of ethylene vinyl acetate (EVA), polyolefin, and polystyrene.

Next, the open operation for locally opening a portion TS of the insulating layer IL to expose the plurality of first and second electrodes C141 and C142 may be performed.

The open operation may use (1) a method for locally irradiating a laser onto the insulating layer IL formed on the first and second electrodes C141 and C142 and selectively removing a portion of the insulating layer IL to expose the plurality of first and second electrodes C141 and C142, and (2) a method for disposing a mask with a pattern capable of exposing the plurality of first and second electrodes C141 and C142 on the insulating layer IL, irradiating ultraviolet (UV) ray onto the mask, and selectively removing a portion of the insulating layer IL to expose the plurality of first and second electrodes C141 and C142.

Figure 20C:
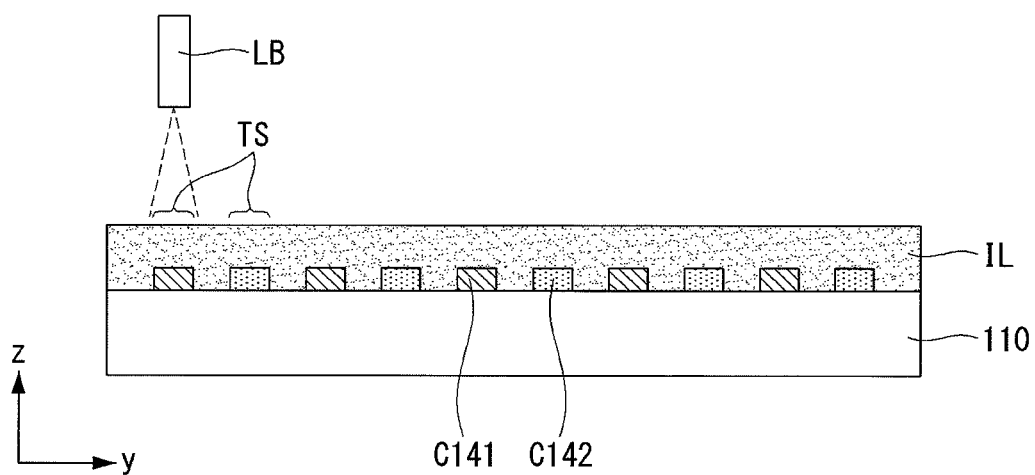

FIG. 20C shows the open operation using the laser, for example.

Figure 20D:
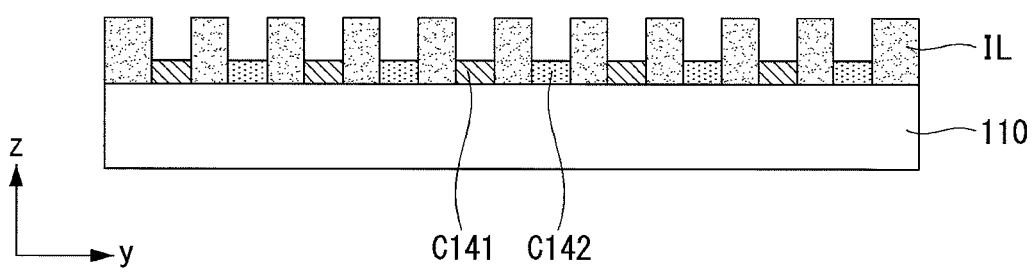

As shown in FIG. 20D, when the laser is used, the laser is selectively irradiated onto the portion TS of the insulating layer IL formed on the first and second electrodes C141 and C142 to remove the portion TS of the insulating layer IL. Hence, the plurality of first and second electrodes C141 and C142 may be exposed.

Next, the metal layer forming operation for forming a metal layer ML on the entire surface of the insulating layer IL and on upper parts of the plurality of first and second electrodes C141 and C142 exposed through the opened portion TS of the insulating layer IL may be performed.

Figure 20E:
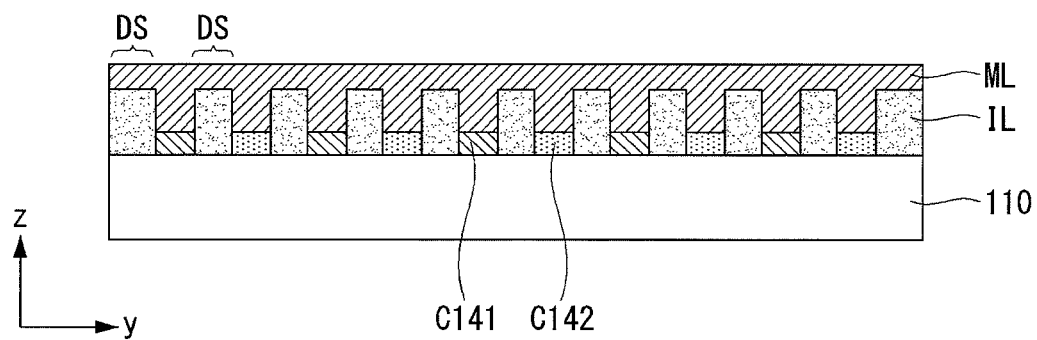

Hence, as shown in FIG. 20E, the metal layer ML may be formed on the entire surface of the insulating layer IL and on the upper parts of the plurality of first and second electrodes C141 and C142. The metal layer ML may contain copper (Cu), for example.

The metal layer forming operation may use plasma sputtering. In this instance, a separate conductive adhesive for attaching the plurality of first electrodes C141 to the first auxiliary electrode P141 and attaching the plurality of second electrodes C142 to the second auxiliary electrode P142 may be omitted.

As shown in FIG. 20E, in the metal layer forming operation, a portion of the metal layer ML may be connected to the plurality of first and second electrodes C141 and C142, and thus the metal layer ML and the plurality of first and second electrodes C141 and C142 may form one body.

Next, as shown in FIG. 20E, the auxiliary electrode forming operation for removing a non-connection portion DS of the metal layer ML, which is not connected to the plurality of first and second electrodes C141 and C142, may be performed.

More specifically, in the auxiliary electrode forming operation, the insulating layer IL formed between the back surface of the semiconductor substrate 110 and the metal layer ML may be removed, and the portion DS of the metal layer ML formed on the insulating layer IL may be removed along with the removed insulating layer IL.

In the auxiliary electrode forming operation, the insulating layer IL may be removed using an etchant or through the irradiation of ultraviolet rays.

For example, when the insulating layer IL is formed of ethylene vinyl acetate (EVA) or polyolefin, the insulating layer IL may be removed using a solution containing xylene or toluene. Further, when the insulating layer IL is formed of polystyrene, the insulating layer IL may be removed using a solution containing d-limonene.

Figure 20F:
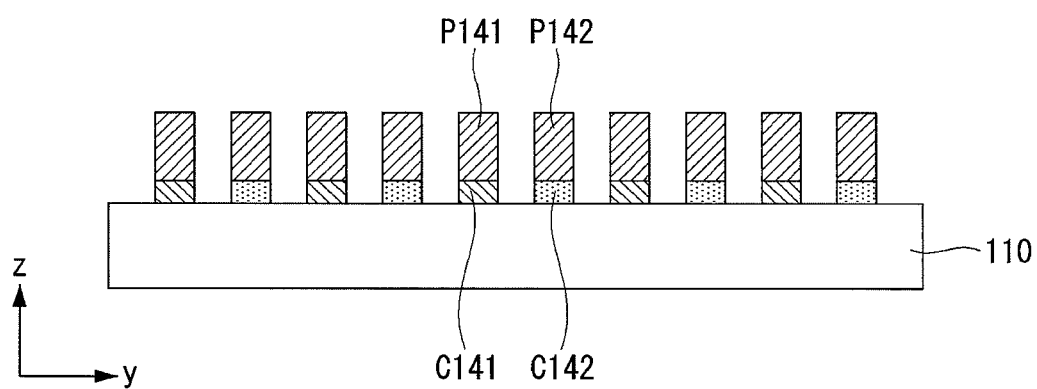

Hence, as shown in FIG. 20F, the first auxiliary electrode P141 and the second auxiliary electrode P142 may be respectively formed on the back surfaces of the first electrodes C141 and the back surfaces of the second electrodes C142 formed on the back surface of the semiconductor substrate 110.

The cell forming operation of the method for manufacturing the solar cell module according to the embodiment of the invention may not use the insulating member 200, unlike the method illustrated in FIGS. 18A to 18I and FIGS. 19A to 19D. Thus, the attaching operation for attaching the insulating member 200 to the back surface of the semiconductor substrate 110 and the peeling operation for removing the insulating member 200 may be omitted in the method for manufacturing the solar cell module according to the embodiment of the invention.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method for manufacturing a solar cell module, the method comprising:
a cell forming operation for forming a first solar cell and a second solar cell by, for each of the first and second solar cells, attaching a plurality of first auxiliary electrodes and a plurality of second auxiliary electrodes to a back surface of a semiconductor substrate on which a plurality of first electrodes and a plurality of second electrodes are formed; and
a cell string forming operation for connecting a first auxiliary electrode among the plurality of first auxiliary electrodes of the first solar cell to a second auxiliary electrode among the plurality of second auxiliary electrodes of the second solar cell through an interconnector to form a cell string,
wherein the cell forming operation includes, for each of the first and second solar cells:
a providing operation for providing a plurality of insulating members each having the plurality of first auxiliary electrodes and the plurality of second auxiliary electrodes;
an attaching operation for attaching the pluralities of first and second auxiliary electrodes to the pluralities of first and second electrodes of each of the first and second solar cells, the plurality of first auxiliary electrodes being overlapped and electrically connected to the plurality of first electrodes and the plurality of second auxiliary electrodes being overlapped and electrically connected to the plurality of second electrodes; and
a peeling operation for separating the plurality of insulating members from the plurality of first auxiliary electrodes and the plurality of second auxiliary electrodes.

2. The method of claim 1, wherein in the attaching operation, the plurality of first auxiliary electrodes and the plurality of second auxiliary electrodes cross a longitudinal direction of the plurality of first electrodes and the plurality of second electrodes, and are attached to the plurality of first electrodes and the plurality of second electrodes.

3. The method of claim 1, wherein in the attaching operation, a conductive adhesive is applied to intersections where the plurality of first electrodes and the plurality of first auxiliary electrodes intersect, and an insulating layer is formed at intersections where the plurality of first electrodes and the plurality of second auxiliary electrodes intersect, and the conductive adhesive is applied to intersections where the plurality of second electrodes and the plurality of second auxiliary electrodes intersect, and the insulating layer is formed at intersections where the plurality of second electrodes and the plurality of first auxiliary electrodes intersect.

4. The method of claim 1, wherein the plurality of first auxiliary electrodes and the plurality of second auxiliary electrodes are temporarily attached to the insulating member using a crosslinking agent.

5. The method of claim 4, wherein the crosslinking agent contains a thermoplastic resin.

6. The method of claim 3, wherein the attaching operation further includes attaching the plurality of first auxiliary electrodes to the plurality of first electrodes using the conductive adhesive and attaching the plurality of second auxiliary electrodes to the plurality of second electrodes using the conductive adhesive.

7. The method of claim 1, wherein a temperature of the peeling operation is lower than a temperature of the attaching operation.

8. The method of claim 7, wherein the temperature of the peeling operation is about 80° C. to 130° C. and the temperature of the attaching operation is about 130° C. to 250° C.

9. The method of claim 1, wherein when a temperature is reduced after the plurality of first auxiliary electrodes and the plurality of second auxiliary electrodes are attached to the plurality of first electrodes and the plurality of second electrodes in the attaching operation, the peeling operation is performed.

10. The method of claim 1, wherein after the attaching operation is completed, the peeling operation is performed through a thermal processing or an irradiation of an ultraviolet ray.

11. The method of claim 1, wherein the cell string forming operation includes attaching one side of the interconnector to a first auxiliary electrode pad connecting one ends of the plurality of first auxiliary electrodes of the first solar cell and attaching another side of the interconnector to a second auxiliary electrode pad connecting one ends of the plurality of second auxiliary electrodes of the second solar cell.

* * * * *